(12) United States Patent  (10) Patent No.: US 8,134,343 B2
Like et al.  (45) Date of Patent: Mar. 13, 2012

(54) ENERGY STORAGE DEVICE FOR STARTING ENGINES OF MOTOR VEHICLES AND OTHER TRANSPORTATION SYSTEMS

(75) Inventors: Nathan Like, Westland, MI (US); Robert F. Gutman, Fraser, MI (US); Christopher Coulter, Northville, MI (US); Michael T. York, Whitmore Lake, MI (US)

(73) Assignee: Flextronics International KFT, Tab (HU)

( * ) Notice: Subject to any disclaimer, the term of this patent is extended or adjusted under 35 U.S.C. 154(b) by 866 days.

(21) Appl. No.: 12/050,615

(22) Filed: Mar. 18, 2008

(65) Prior Publication Data

US 2008/0265586 A1   Oct. 30, 2008

Related U.S. Application Data

(60) Provisional application No. 60/914,537, filed on Apr. 27, 2007, provisional application No. 60/969,782, filed on Sep. 4, 2007.

(51) Int. Cl.
*H02J 7/00* (2006.01)
(52) U.S. Cl. ........................................................ 320/166
(58) Field of Classification Search .................. 320/166
See application file for complete search history.

(56) References Cited

U.S. PATENT DOCUMENTS

| 4,161,682 A | 7/1979 | Corvette |
| 4,412,137 A | 10/1983 | Hanson et al. |
| 4,492,912 A | 1/1985 | Nowakowski |
| 4,510,431 A | 4/1985 | Winkler |
| 4,540,929 A | 9/1985 | Binkley |
| 4,684,814 A | 8/1987 | Radomski |
| 4,727,306 A | 2/1988 | Misak et al. |
| 4,857,820 A | 8/1989 | Tompkins et al. |

(Continued)

FOREIGN PATENT DOCUMENTS

EP        0390398        10/1990

(Continued)

OTHER PUBLICATIONS

John R. Miller, Joseph Burgel, Henry Catherirno, Fred Krestik, John Monroe, and James R. Stafford, Truck Starting Using Electrochemical Capacitors, 1998, pp. 1-7.

(Continued)

*Primary Examiner* — Arun Williams
(74) *Attorney, Agent, or Firm* — Per H. Larsen; Robert G. Crouch; Marsh Fischmann & Breyfogle LLP

(57) ABSTRACT

An energy storage device for storing energy for starting an internal combustion engine of a motor vehicle includes a DC-DC converter, a plurality of capacitors connected electrically to the DC-DC converter, and a housing for containing the DC-DC converter and the capacitors. The DC-DC converter converts a voltage provided by the motor vehicle's battery to a second voltage stored by the capacitors. During an engine start cycle, energy discharges from the capacitors to the starter motor of the engine, wherein the stored voltage of the capacitors provides energy to start the engine. The capacitors are recharged by the vehicle's battery. A thermally insulated barrier separates the DC-DC converter and the capacitors. The housing may be sized and shaped substantially as that of a standard motor vehicle battery, enabling the energy storage device to be installed within the motor vehicle as a substitute for one or more of the vehicle's batteries.

18 Claims, 25 Drawing Sheets

U.S. PATENT DOCUMENTS

| | | | |
|---|---|---|---|
| 4,902,955 | A | 2/1990 | Manis et al. |
| 5,041,776 | A | 8/1991 | Shirata et al. |
| 5,077,513 | A | 12/1991 | Dea et al. |
| 5,146,095 | A | 9/1992 | Tsuchiya et al. |
| 5,155,373 | A | 10/1992 | Tsuchiya et al. |
| 5,155,374 | A | 10/1992 | Shirata et al. |
| 5,157,267 | A | 10/1992 | Shirata et al. |
| 5,207,194 | A | 5/1993 | Clerici |
| 5,260,637 | A | 11/1993 | Pizzi |
| 5,285,862 | A | 2/1994 | Furutani et al. |
| 5,321,389 | A | 6/1994 | Meister |
| 5,350,994 | A | 9/1994 | Kinoshita et al. |
| 5,488,283 | A | 1/1996 | Dougherty et al. |
| 5,498,951 | A | 3/1996 | Okamura |
| 5,552,681 | A | 9/1996 | Suzuki et al. |
| 5,563,454 | A | 10/1996 | Araki et al. |
| 5,623,399 | A | 4/1997 | Ishii et al. |
| 5,637,978 | A | 6/1997 | Kellett et al. |
| 5,642,696 | A | 7/1997 | Matsui |
| 5,705,859 | A | 1/1998 | Karg et al. |
| 5,783,872 | A | 7/1998 | Blair |
| 5,793,185 | A | 8/1998 | Prelec et al. |
| 5,818,115 | A | 10/1998 | Nagao |
| 5,909,358 | A * | 6/1999 | Bradt .......................... 361/707 |
| 5,925,938 | A | 7/1999 | Tamor |
| 5,966,078 | A * | 10/1999 | Tanguay .................... 340/636.1 |
| 5,977,744 | A | 11/1999 | Williams et al. |
| 5,998,961 | A | 12/1999 | Brown |
| 6,050,233 | A | 4/2000 | Vilou |
| 6,075,331 | A | 6/2000 | Ando et al. |
| 6,109,229 | A | 8/2000 | Pels |
| 6,130,519 | A | 10/2000 | Whiting et al. |
| 6,202,615 | B1 | 3/2001 | Pels et al. |
| 6,222,342 | B1 | 4/2001 | Eggert et al. |
| 6,242,887 | B1 | 6/2001 | Burke |
| 6,265,851 | B1 | 7/2001 | Brien et al. |
| 6,325,035 | B1 | 12/2001 | Codina et al. |
| 6,326,761 | B1 | 12/2001 | Tareilus |
| 6,362,595 | B1 | 3/2002 | Burke |
| 6,371,067 | B1 | 4/2002 | Schmitz et al. |
| 6,420,793 | B1 | 7/2002 | Gale et al. |
| 6,426,606 | B1 | 7/2002 | Purkey |
| 6,481,406 | B2 | 11/2002 | Pels |
| 6,497,209 | B1 | 12/2002 | Karuppana et al. |
| 6,717,291 | B2 | 4/2004 | Purkey |
| 6,744,146 | B2 | 6/2004 | Fulton et al. |
| 6,819,010 | B2 | 11/2004 | Burke |
| 6,871,625 | B1 | 3/2005 | Burke |
| 6,888,266 | B2 | 5/2005 | Burke et al. |
| 6,988,475 | B2 | 1/2006 | Burke |
| 7,095,135 | B2 | 8/2006 | Purkey |
| 7,134,415 | B2 | 11/2006 | Burke et al. |
| 7,145,259 | B2 | 12/2006 | Spellman et al. |
| 7,145,788 | B2 | 12/2006 | Plummer |
| 7,198,016 | B2 | 4/2007 | Burke |
| 7,319,306 | B1 * | 1/2008 | Rydman et al. ............... 320/166 |
| 2001/0017039 | A1 | 8/2001 | Weimer |
| 2002/0024322 | A1 * | 2/2002 | Burke .......................... 320/166 |
| 2003/0039092 | A1 | 2/2003 | Kanouda |
| 2003/0075134 | A1 | 4/2003 | Burke |
| 2004/0093723 | A1 * | 5/2004 | Kintis et al. ...................... 29/830 |
| 2006/0096794 | A1 | 5/2006 | Yoshida |
| 2006/0137918 | A1 | 6/2006 | Dinser et al. |
| 2008/0136374 | A1 * | 6/2008 | Nelson et al. .................. 320/128 |
| 2009/0261787 | A1 * | 10/2009 | Cegnar et al. .................. 320/166 |

FOREIGN PATENT DOCUMENTS

| | | |
|---|---|---|
| FR | 2 853 153 | 10/2004 |
| SU | 1265388 | 10/1986 |
| WO | WO 91/01041 | 1/1991 |

OTHER PUBLICATIONS

John R. Miller, "Engineering Battery-Capacitor Combinations in High Power Applications: Diesel Engine Starting," Dec. 1999, pp. 1-11.

Goodall Mfg. LLC, "Charge-All Wheel Type Battery Chargers" Brochure, p. 19 Circa Dec. 2000; Eden Prairie Minn.

Kbi/Koldban Int'l Ltd., "KAPower Super Capacitors", Brochure, pp. 1-4; Circa Dec. 2000; Lake in the Hills, Ill.

Kbi/Koldban Int'l., "KAPower Installation-Operation Manual," pp. 1-12; Circa Jun. 2000; Lake in the Hills, Ill.

Purkey Fleet Electric, Inc., "Battery Optimizer", Brochure, pp. 1-2; 1998; Rogers Ark.

Sure Power Industries, Inc., "Low-Voltage Disconnects" Brochure, pp. 1-2; Circa Aug. 1998; Tualatin, Oregon.

Fuzzy Control of a Hybrid Power Source for Fuel Cell Electric Vehicle using Regenerative Braking Ultracapacitor, pp. 1389-1394, 2006.

The Role of Ultracapacitors in an Energy Storage Unit for Vehicle Power Management, pp. 3236-3240, 2003.

Ultracapacitor with Ballard Nexa in a Gem Vehicle in a Hybrid Mode, pp. 317-320, 2005.

35 KW Ultracapacitor Unit for Power Management of Hybrid Electric Vehicles: Bi-Directional DC-DC Converter Design, pp. 2157-2163, 2004.

A Purely Ultracapacitor Energy Storage System for Hybrid Electric Vehicles Utilizing a Microcontroller-Based dc-dc Boost Converter, pp. 1160-1164, 2004.

Maximum Charging of an Ultra-Capacitor Using Switch Mode Rectifiers in a Regeneration Cycle, pp. 737-741, 2005.

Ultracapacitors Give Truckers a Jump Start, Jul. 2007.

Goodall Mfg., LLC, 13-400 Super Boost-All Control Box with 25ft., 2 ga. Welding Cable and Clamps and 13-404 Super Boost-All Control Box with 25ft., 1/0 ga. Welding Cable and Clamps, Mar. 21, 2007.

Kbi/Koldban Int'l, Ether System and Capacitors, "Kbi KAPower", pp. 1-3, Jan. 30, 2007.

Brian P. Roberts, R.M. Nelms, and L.L. Grigsby, "Feedfoward Control of Parallel Resonant DC-DC Converter with Capacitor Input Source", pp. 691-696, 1996.

Micah Ortuzar, Juan Dixon (SM IEEE) and Jorge Moreno, "Design, Construction and Performance of a Buck-Boost Converter for an Ultracapacitor-Based Auxiliary Energy System for Electric Vehicles", pp. 2889-2894, 2003.

Abhishek Drolia, Philip Jose and Ned Mohan, "An Approach to Connect Ultracapacitor to Fuel Cell Powered Electric Vehicle and Emulating Fuel Cell Electrical Characteristics using Switched Mode Converter", pp. 897-901, 2003.

D. Spillane, D. O'Sullivan, M.G. Egan and J.G. Hayes, "Supervisory Control of a HV Integrated Starter-Alternator with Ultracapacitor Support Within the 42 V Automotive Electrical System", pp. 1111-1117, 2003.

Troy A. Nergaard, Jeremy F. Ferrell, Leonard G. Leslie and Jih-Sheng Lai, "Design Considerations for a 48V Fuel Cell to Split Single Phase Inverter System with Ultracapacitor Energy Storage", pp. 2007-2012, 2002.

R.M. Schupbach and J.C. Balda, "Comparing DC-DC Converters for Power Management in Hybrid Electric Vehicles", pp. 1369-1374, 2003.

A. DiNapoli, F. Crescimbini, F. Giulii Caponni and L. Solero, "Control Strategy for Multiple Input DC-DC Power Converters Devoted to Hybrid Vehicle Propulsion Systems", pp. 1036-1041, 2002.

A. DeNapoli, F. Crescimbini, S. Rodo, L. Solero, "Multiple Input DC-DC Power Converter for Fuel-Cell Powered Hybrid Vehicles", pp. 1685-1690, 2002.

Xinxiang Yan, Allan Seckold and Dean Patterson, "Development of a Zero-Voltage-Transition Bidirectional DC-DC Converter for a Brushless DC Machine EV Propulsion System", pp. 1661-1666, 2002.

Juan W. Dixon and Micah E. Ortuzar, "Ultracapacitors + DC-DC Converters in Regenerative Braking System", pp. 16-21, Aug. 2002.

B.J. Arnet, L.P. Haines, "Combining Ultra-Capacitors with Lead-Acid Batteries", 9 pages.

A. DiNapoli, F. Caricchi and F. Crescimbini, "Ultracapacitor Based Bidirectional DC-DC Converter Prototype for Recovery of the Braking Energy in EV Motor Drives", pp. 2141-2146.

Vanner Incorporated, "Start Sentry Ultracapacitors", Brochure, 5 pages.

Sure Power Industries, Inc., "Crank Assist Controller", Flyer, 1 page.

Sure Power 12V Cap Start Module, photograph from EVS-23 Tradeshow dated Dec. 2-5, 2007, 1 page.

Nippon-Chemi-con Engine Starter Modules Type 1 and Type 2, photographs from EVS-23 Tradeshow dated Dec. 2-5, 2007, 2 pages.

Applicants' co-pending design U.S. Appl. No. 29/305,028 entitled Energy Storage Device, filed Mar. 12, 2008, (19 pages).

Invitation to Pay Additional Fees issued in connection with Applicants' International Appln. No. PCT/US2008/060598 (7 pages).

* cited by examiner

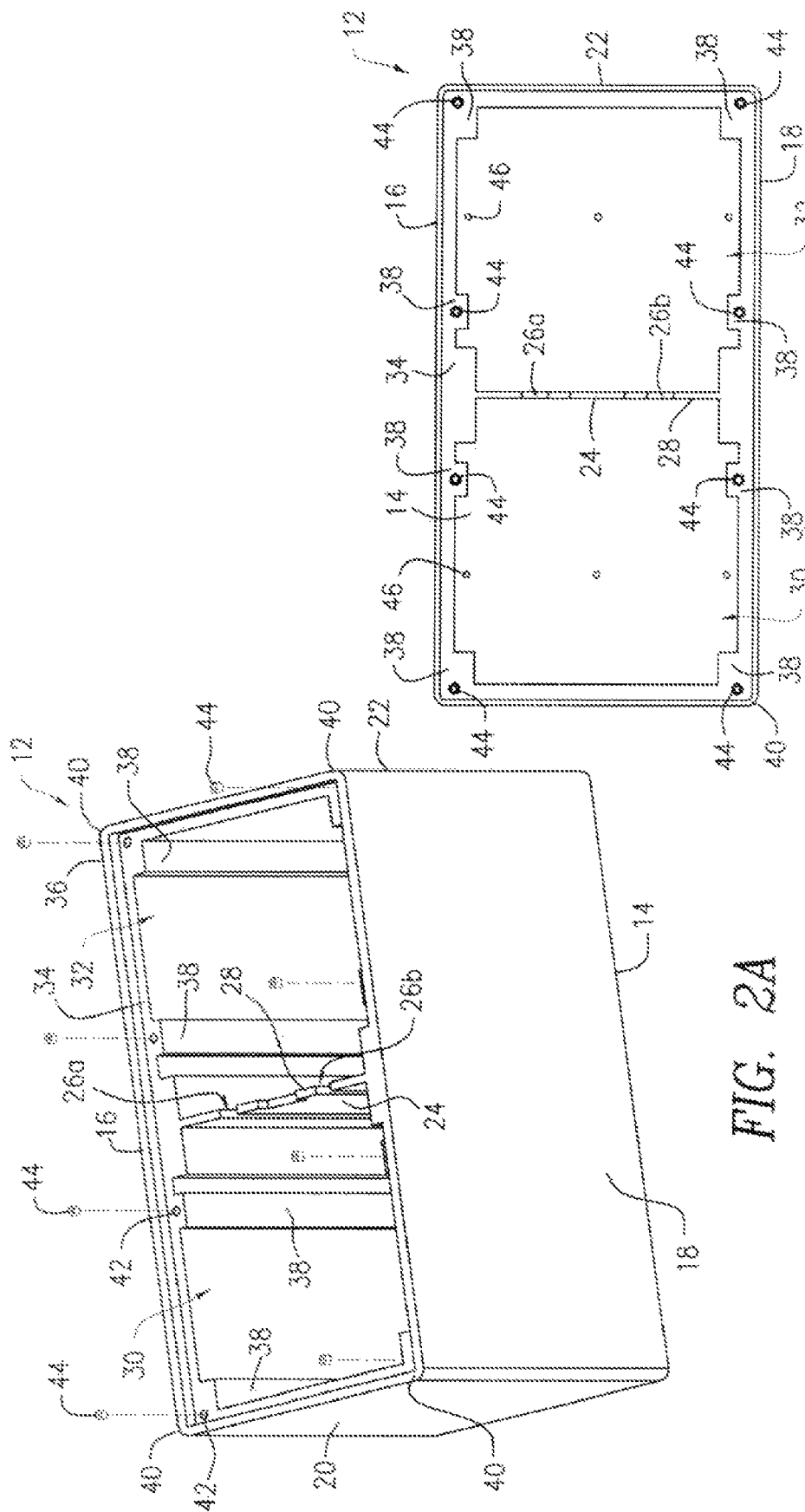

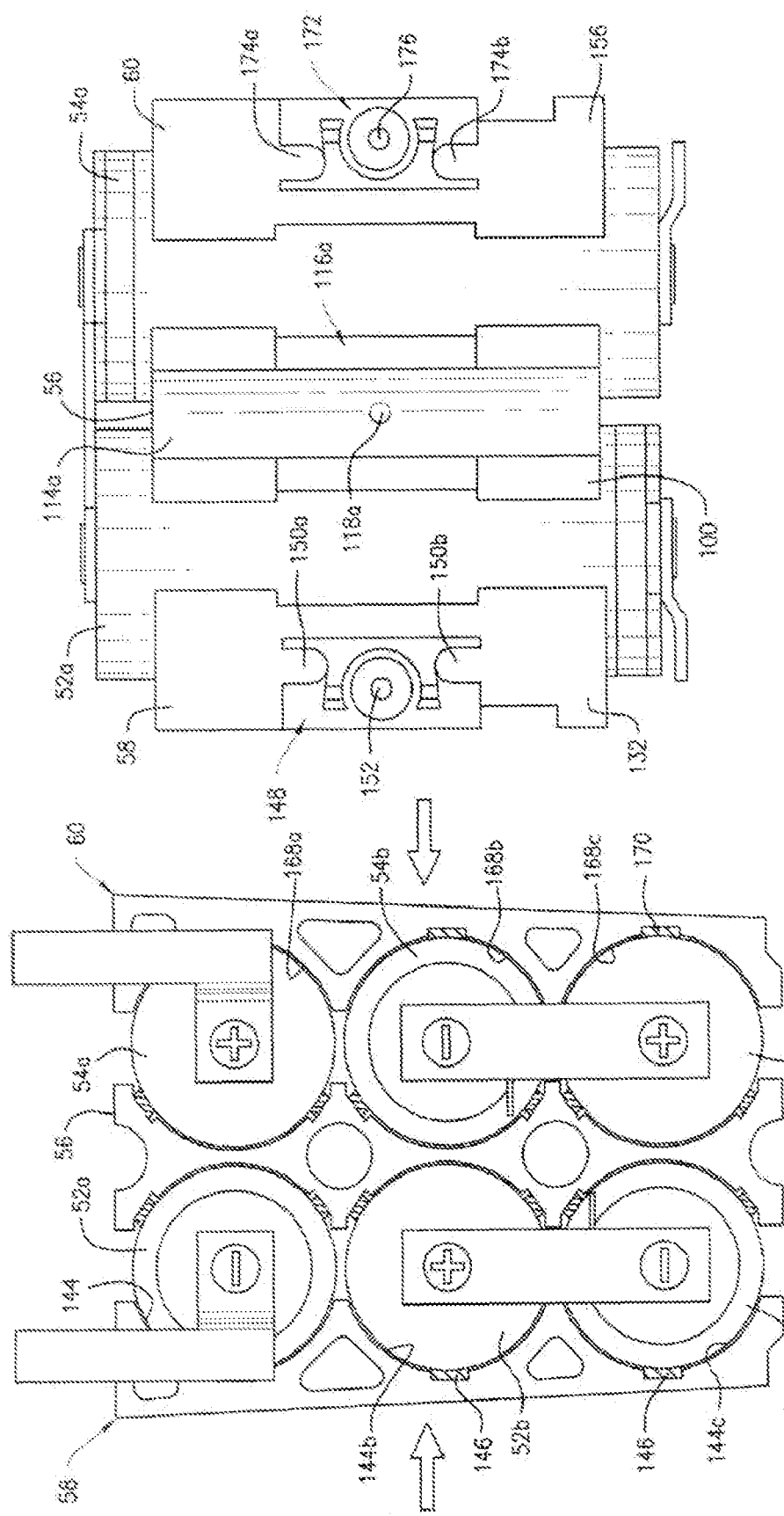

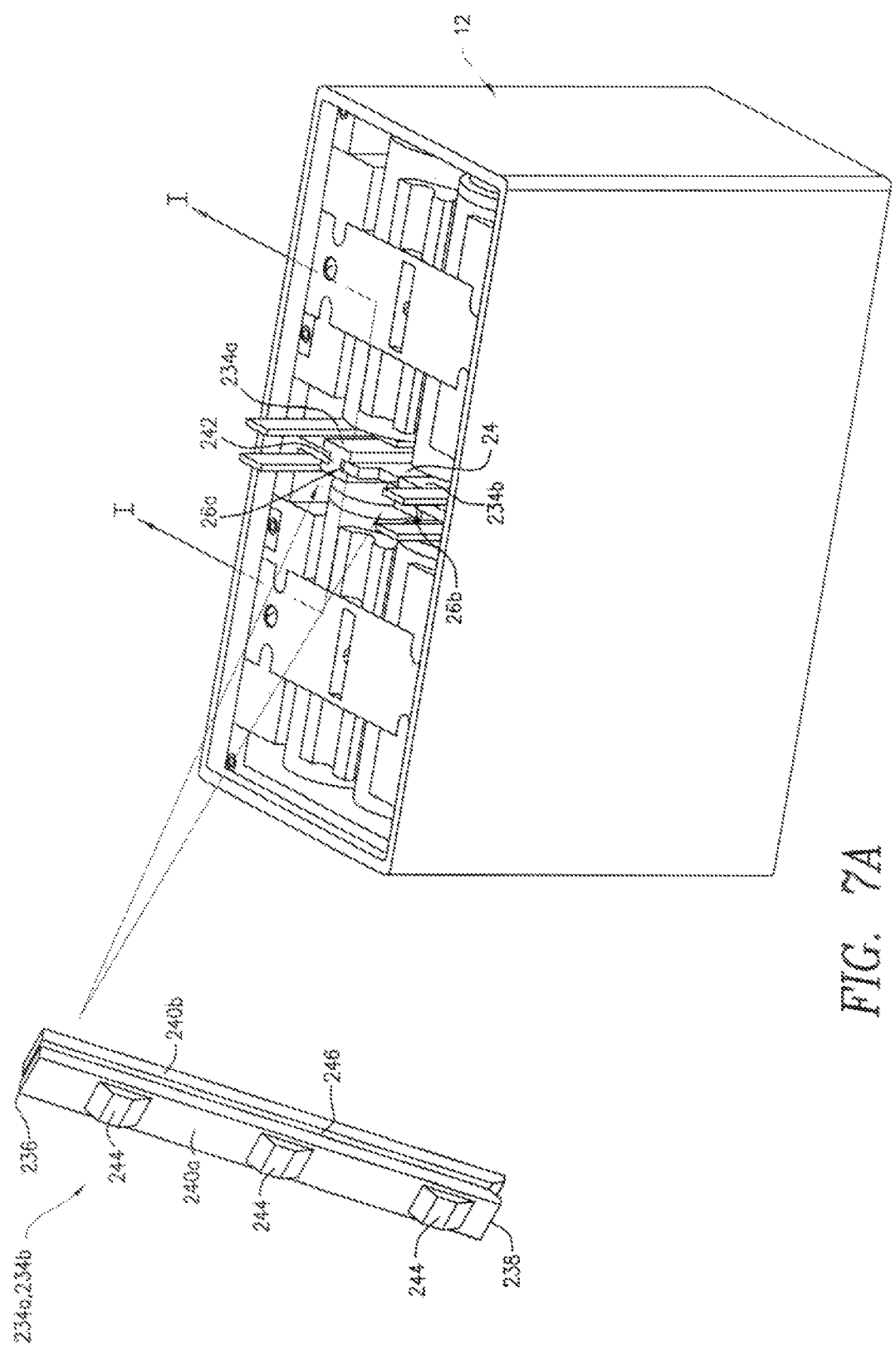

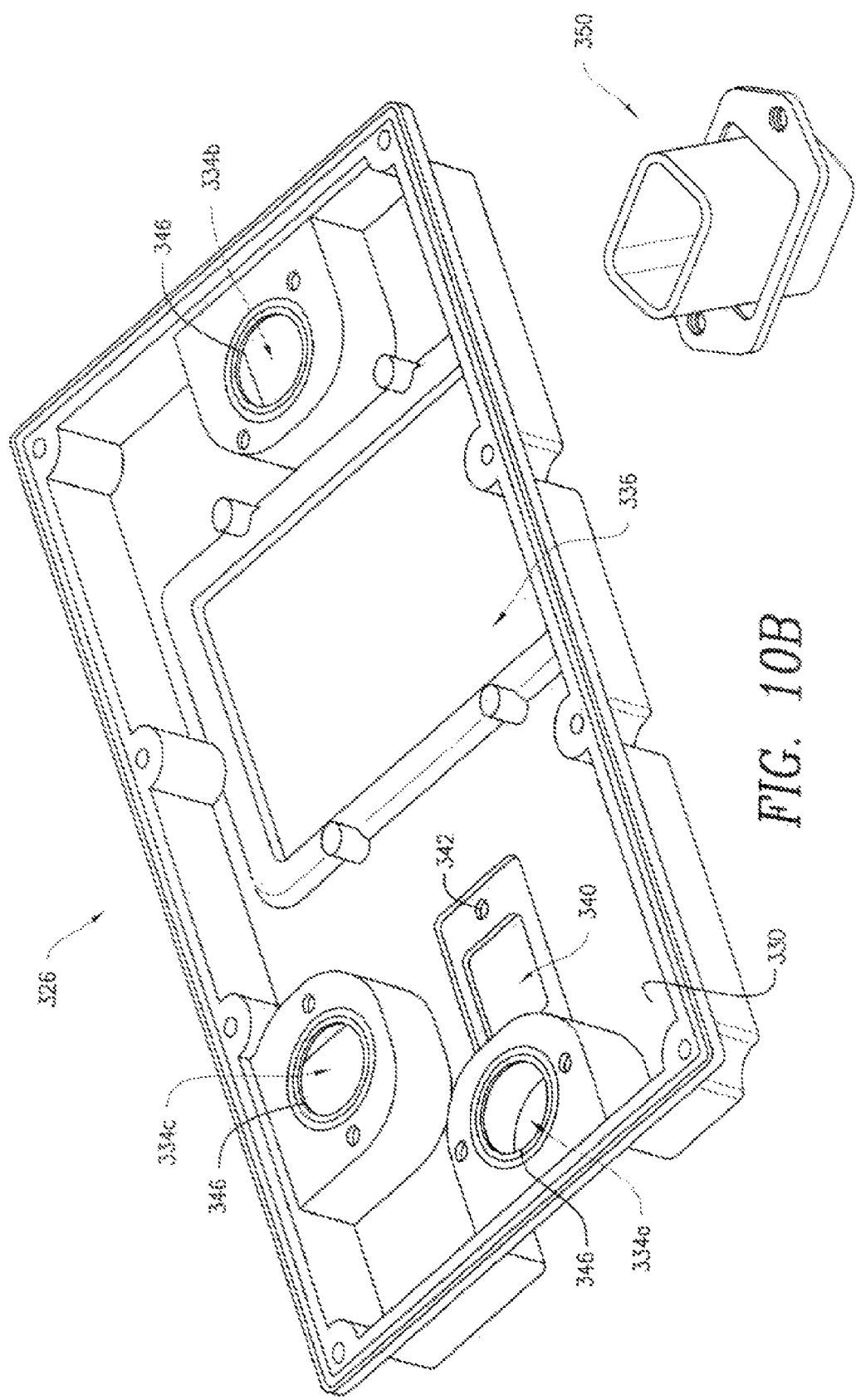

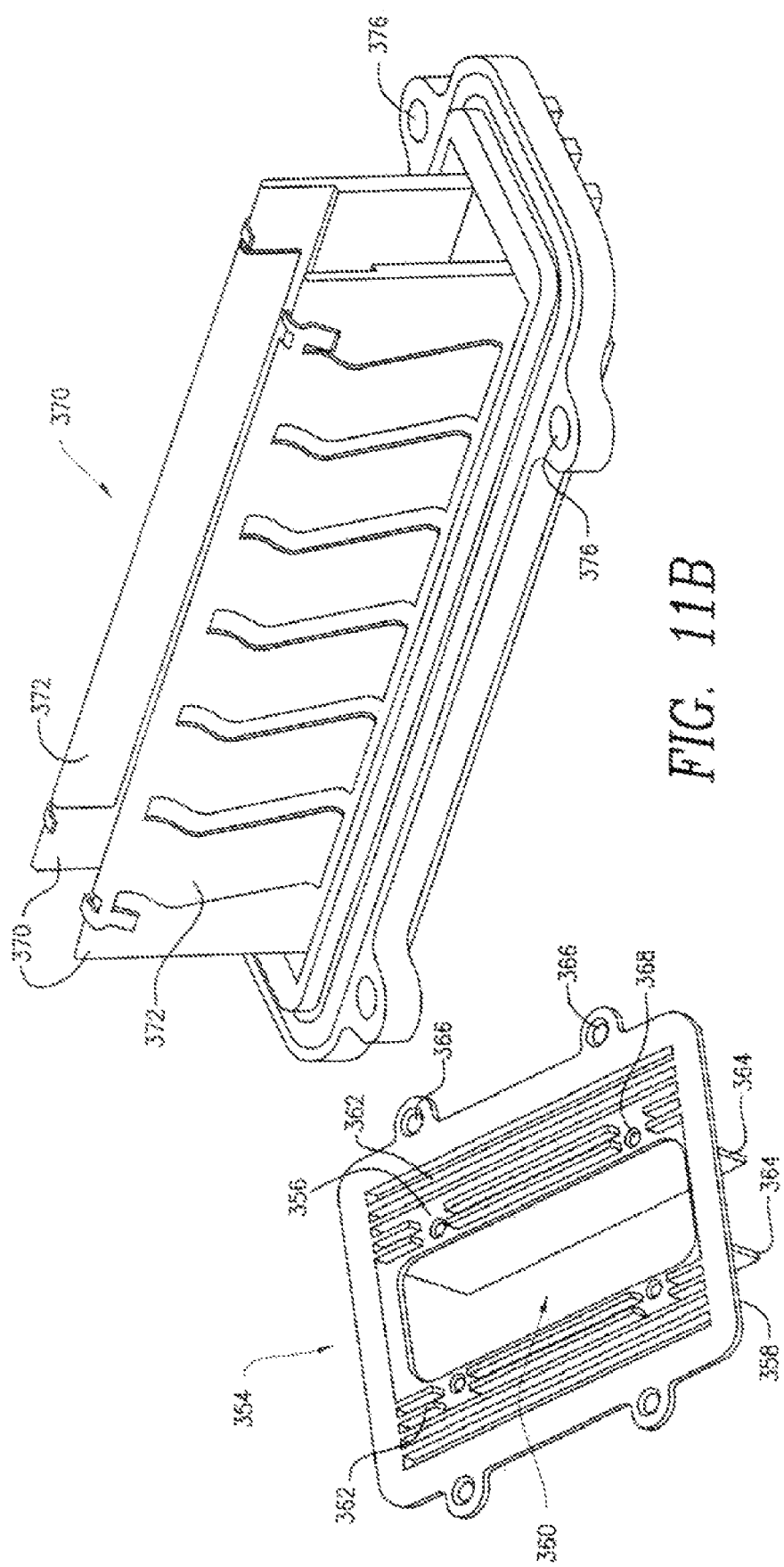

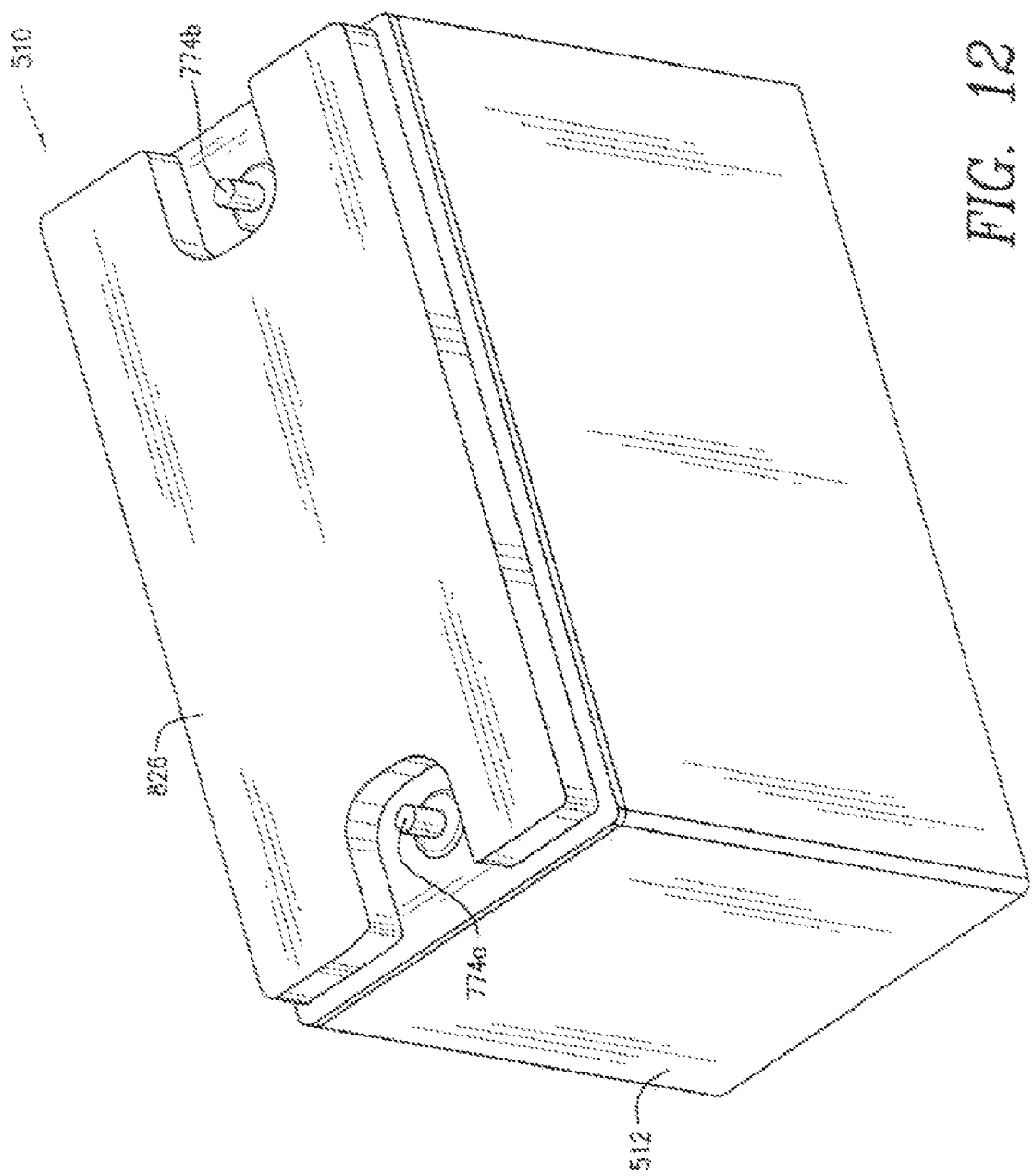

ENERGY STORAGE DEVICE FOR STARTING ENGINES OF MOTOR VEHICLES AND OTHER TRANSPORTATION SYSTEMS

CROSS-REFERENCE TO RELATED APPLICATIONS

This application is a Section 111(a) application relating to commonly owned, U.S. Provisional Application Ser. No. 60/914,537 entitled "ENERGY STORAGE FOR VEHICLE COLD START DEVICE," filed Apr. 27, 2007, and commonly owned, U.S. Provisional Application Ser. No. 60/969,782 entitled "COLD STARTING DEVICE FOR INTERNAL COMBUSTION ENGINES," filed Sep. 4, 2007.

FIELD OF THE INVENTION

The present invention relates to an energy storage device and, more particularly, an energy storage device for starting engines of motor vehicles and other electrical devices.

BACKGROUND OF THE INVENTION

Motor vehicles typically utilize a starter motor for starting the vehicle's engine. The starter motor is supplied with electrical energy from a battery, such as a lead storage battery. The battery is typically charged by an alternator while the motor vehicle is running. When the battery is discharged to a level below that of a threshold start voltage, the battery, by itself, cannot supply an adequate current to the starter motor at the time of starting the engine.

SUMMARY OF THE INVENTION

An energy storage device for starting an internal combustion engine of a motor vehicle includes a DC-DC converter, a plurality of capacitors connected electrically to the DC-DC converter, and a housing for containing the DC-DC converter and the capacitors. The capacitors are retained within one or more retention structures, which are arranged in a modular fashion. The retention structures are installed removably within the housing. The housing may be sized and shaped as a standard motor vehicle battery, thereby enabling the energy storage device to be easily installed within a motor vehicle as a substitute for one or more of the vehicle's batteries.

The DC-DC converter converts a voltage provided by the motor vehicle battery to a second voltage, which is stored by the capacitors. The DC-DC converter has a control system, which ensures that the capacitors are charged at the correct voltage. During an engine start cycle, energy discharges from the capacitors to the starter motor of the engine, wherein the stored voltage of the capacitors provides energy to start the vehicle engine. The capacitors are recharged by the vehicle's battery.

The capacitors provide power and energy directly to the vehicle's engine starter motor, while the vehicle's battery provides power to the DC-DC converter in order to charge and recharge the capacitors. As a result, the electrical connection between the engine starter motor and the energy storage device is separate and distinct from the electrical connection between the device and the vehicle's battery.

The energy storage device further includes an insulated, thermal barrier positioned between the DC-DC converter and the capacitors. The barrier physically separates the DC-DC converter and the capacitors, thereby protecting the capacitors from any heat generated by the DC-DC converter. A heat sink is provided to allow heat generated by the DC-DC converter to dissipate to the atmosphere.

Specifically, the present invention may be used for starting an internal combustion engine for a motor vehicle. However, the present invention can be utilized in connection with other types of engines or vehicles. In addition, the present invention can be used to supply electric loads for various transportation systems applications, such as electrical motors, electric steering devices, electrically boosted turbo chargers, lift gates for trucks, tractor trailers and other vehicles, electrical hydraulic systems, and other similar devices and applications. Further features and advantages of the invention will appear more clearly on a reading of the detailed description of the exemplary embodiments of the invention, which are given below by way of example only with reference to the accompanying drawings.

BRIEF DESCRIPTION OF THE DRAWINGS

Reference is made to the following detailed description of the exemplary embodiments considered in conjunction with the accompanying drawings, in which:

FIG. 2A is a top perspective view of a housing employed by the energy storage device shown in FIG. 1;

FIG. 2B is a top plan view of the housing shown in FIG. 2A;

FIG. 3C is a front elevational view of the cell module shown in FIG. 3A;

FIG. 3D is a top plan view of the cell module shown in FIG. 3C;

FIG. 7A is a perspective view of a retaining module employed by the energy storage device shown in FIG. 1, and pair of such retaining modules in their respective inserted positions within the housing and cell modules assembly shown in FIG. 6;

FIG. 10B shows a bottom perspective view of the housing cover shown in FIG. 10A;

FIG. 10C shows a top perspective view of a connector employed by the energy storage device shown in FIG. 1;

FIG. 11A shows a top perspective view of a heat sink employed by the energy storage device shown in FIG. 1;

FIG. 11B shows a spring retainer assembly employed by the heat sink shown in FIG. 11A;

FIG. 12 shows a top perspective view of a second exemplary embodiment of the energy storage device shown in FIG. 1.

DETAILED DESCRIPTION OF THE EXEMPLARY EMBODIMENTS

Figure 1:
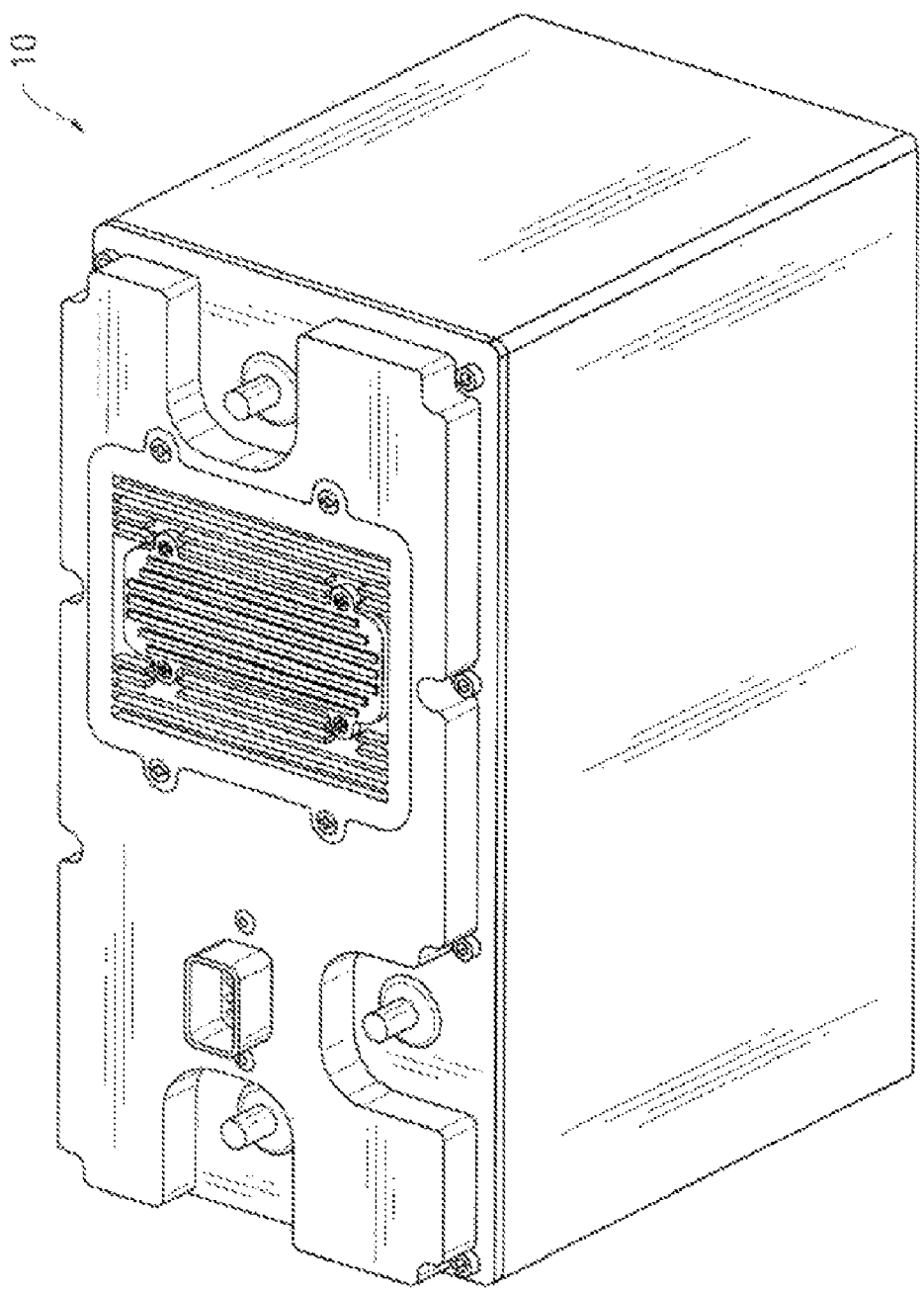
FIG. 1 is a top perspective view of an energy storage device constructed in accordance with an exemplary embodiment.

FIG. 1 shows an energy storage device 10 as fully assembled. The components and the process of constructing the energy storage device 10 shall be described hereinafter.

Referring to FIGS. 2A and 2B, the energy storage device 10 includes a rectangular box-shaped housing 12 having a rectangular-shaped base 14, a first pair of opposed rectangular-shaped sidewalls 16, 18 extending upwardly from the base 14, and a second pair of opposed rectangular-shaped sidewalls 20, 22 extending upwardly from the base 14. A centrally positioned dividing wall 24 extends upwardly from the base 14 intermediate and parallel to the sidewalls 20, 22, and runs from the sidewall 16 to the sidewall 18. The dividing wall 24 includes a pair of elongated slots 26a, 26b that extend downwardly from a top end 28 thereof towards the base 14. The functions of the slots 26a, 26b shall be described hereinafter.

With continued reference to FIGS. 2A and 2B, the sidewalls 16, 18, the sidewall 20 and the dividing wall 24 form a first cubical-shaped chamber 30, while the sidewalls 16, 18, the sidewall 22 and the dividing wall 24 form a second cubical-shaped chamber 32. Preferably, the chambers 30, 32 are identical in size and shape, but they need not be and can consist of other shapes and sizes. The purposes of the chambers 30, 32 shall be described hereinafter.

Still referring to FIGS. 2A and 2B, a rectangular-shaped ridge 34 is formed along the perimeter of the housing 12 and is recessed from a top end 36 thereof. A plurality of rectangular-shaped posts 38 extend perpendicularly from the ridge 34 to the base 14. A post 38 is positioned proximate to each corner 40 of the housing 12, two of the posts 38 are positioned along the sidewall 16 of the housing 12 and bisected by the dividing wall 24, and two of the posts 38 are positioned along the sidewall 18 of the housing 12 and bisected by the dividing wall 24. Each of the posts 38 includes an aperture 42, which is sized and shaped to receive a threaded insert 44. An adhesive, such as an epoxy, may be used to secure the inserts 44 within the apertures 42 (not shown in the Figures).

With particular reference to FIG. 2B, the housing 12 includes a plurality of circular-shaped vent holes 46 formed within the base 14. The holes 46 allow for air to circulate within the housing 12 and cool the interior thereof. The holes 46 may be plugged by corresponding circular-shaped filters (not shown in the Figures), which prevent dirt and other foreign particles from entering the housing 12, while allowing the holes 46 to perform their function. Alternatively, the filters need not be included. Preferably, the housing 12 includes the six holes 46, but the housing 12 may include greater or less than the six holes 46. Alternatively, the housing 12 need not include the holes 46.

By way of example, the dimensions of the housing 12 can be substantially similar to those of a Group 31 type, heavy duty commercial vehicle battery, namely, a length of approximately 13 inches (330 mm), a width of approximately 6-13/18 inches (173 mm), and a height of approximately 9-7/16 inches (240 mm). However, the housing 12 may consist of other shapes and sizes, including, but not limited to, shapes and sizes characterized by other battery group types for passenger vehicles, light commercial vehicles, and heavy-duty commercial vehicles, in order to suit the purposes of the varied configurations to be appreciated from the teachings herein.

Preferably, the housing 12 is manufactured from an insulating material, such as a polymeric material. One example of a polymeric material suitable for manufacturing the housing 12 is a thermoplastic material. Alternatively, the housing 12 may be made from other suitable materials known in the art.

Figure 6:
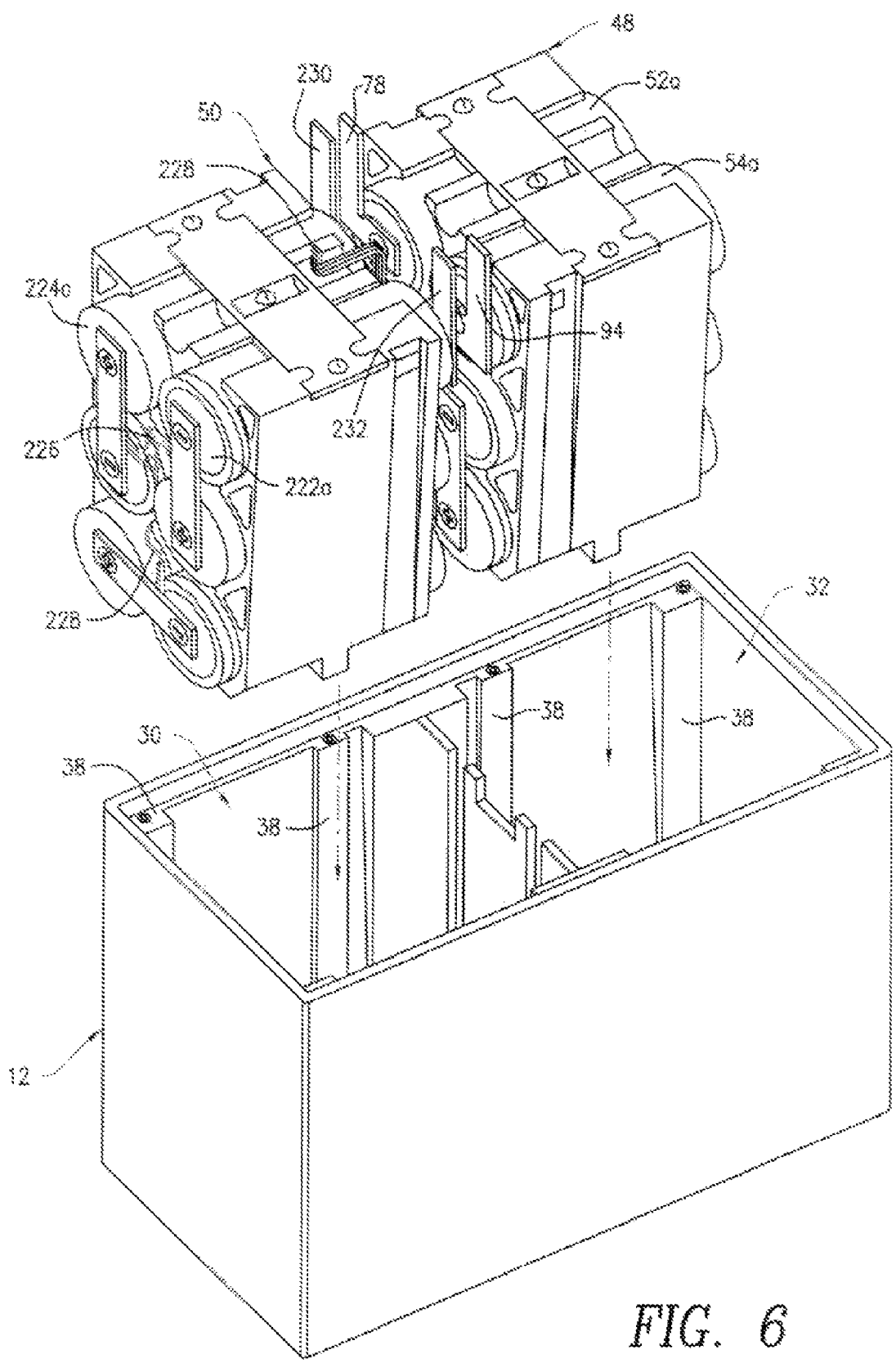
FIG. 6 is a top perspective view of the cell modules shown in FIGS. 4C and 5 being inserted into the housing shown in FIG. 2A.

Referring briefly to FIG. 6, the energy storage device 10 includes a first cell module 48 and a second cell module 50. The first cell module 48 is virtually identical to the second cell module 50, with some minor exceptions to be described hereinafter. Accordingly, a detailed description of only the first cell module 48 shall be provided herein for the sake of brevity.

Figure 3A:
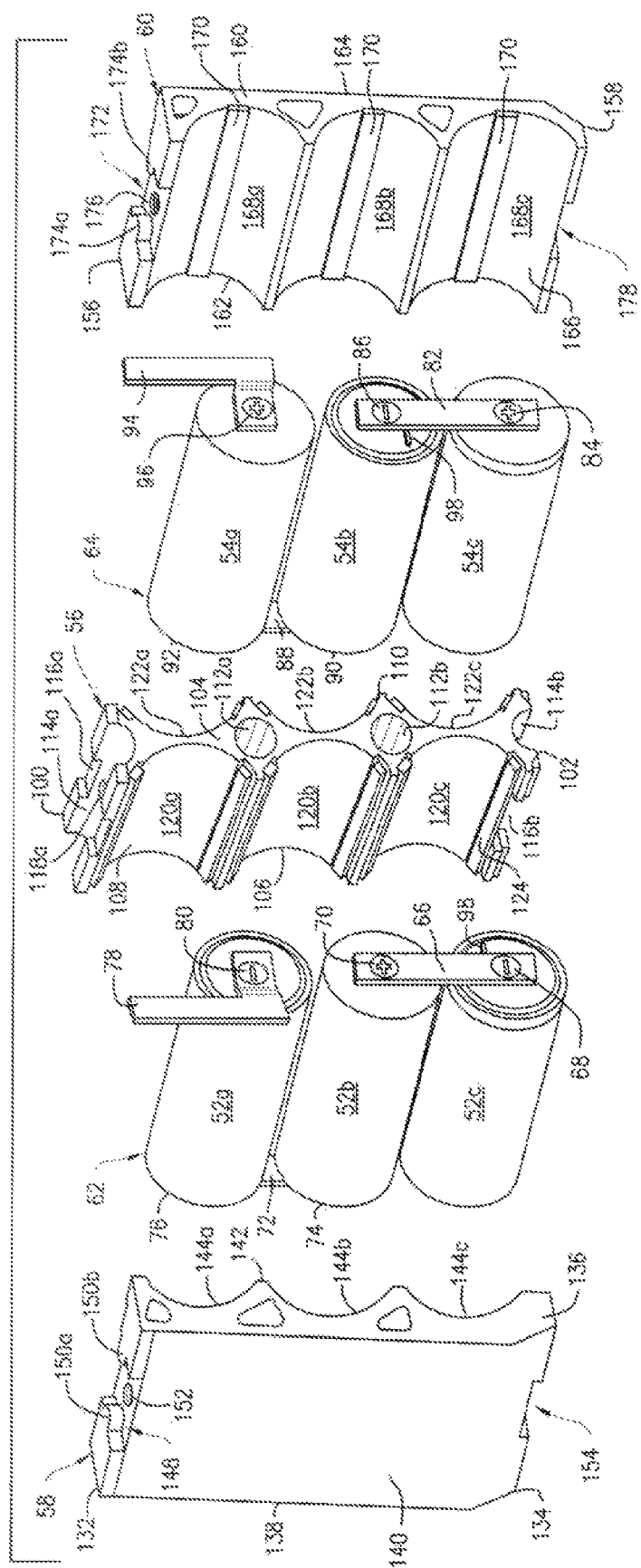
FIG. 3A is an exploded, front perspective view of a partially assembled cell module employed by the energy storage device shown in FIG. 1.

Referring to FIG. 3A, the first cell module 48 includes a first plurality of cylindrical-shaped capacitors 52a, 52b, 52c, a second plurality of cylindrical-shaped capacitors 54a, 54b, 54c, a center cradle 56, and a pair of outer cradles 58, 60. As described hereinafter, the center cradle 56 and the outer cradles 58, 60 cooperate to provide a retention structure for supporting the capacitors. The capacitors 52a, 52b, 52c are arranged in a first stacked column 62, while the capacitors 54a, 54b, 54c are arranged in a second stacked column 64. The first column 62 includes a rectangular-shaped buss bar 66 that connects mechanically and electrically a negative terminal 68 of the capacitor 52c with a positive terminal 70 of capacitor 52b, and a rectangular-shaped buss bar 72 that connects mechanically and electrically a negative terminal 74 of the capacitor 52b with a positive terminal 76 of the capacitor 52a. An L-shaped terminal 78 is connected to a negative terminal 80 of the capacitor 52a. Similarly, the second column 64 includes a rectangular-shaped buss bar 82 that connects mechanically and electrically a positive terminal 84 of the capacitor 54c with a negative terminal 86 of the capacitor 54b, while a rectangular-shaped buss bar 88 connects mechanically and electrically a positive terminal 90 of the capacitor 54b with a negative terminal 92 of the capacitor 54a. An L-shaped terminal 94 is connected to a positive terminal 96 of the capacitor 54a. Each of the buss bars 66, 72, 82 and 88 includes a monitoring terminal 98 that extends perpendicularly therefrom. The monitoring terminals 98 enable a user to monitor the voltage stored by the capacitors 52a, 52b, 52c and the capacitors 54a, 54b, 54c. The monitoring terminals 98 may be separate and distinct components that are attached to the buss bars 66, 72, 82 and 88 by, for example, laser welding. Other methods known in the art can be used to connect the monitoring terminals 98 to the buss bars 66, 72, 82 and 88, or the monitoring terminals 98 can formed integrally therewith. Alternatively, the buss bars 66, 72, 82 and 88 need not include the monitoring terminals 98.

The term "capacitor" is defined as an electrical device that can store energy in an electric field between a pair of closely-spaced conductors. The capacitors 52a, 52b, 52c and the capacitors 54a, 54b, 54c can be electrochemical capacitors.

Preferably, each of the capacitors 52a, 52b, 52c and the capacitors 54a, 54b, 54c is a cylindrical, double-layer, high-density, electrochemical capacitor having a capacitance in a range of about 1,200 Farads to about 3,000 Farads (sometimes referred to in the art as an "ultracapacitor"). The capacitors 52a, 52b, 52c and the capacitors 54a, 54b, 54c may be composed of activated carbon matrix surfaces on sheets of aluminum, and may be supplied by Maxwell Technologies, Inc. Alternatively, each of the capacitors 52a, 52b, 52c and the capacitors 54a, 54b, 54c can consist of other types, shapes and sizes, have different capacitance levels, and may be made by other manufacturers. While the first cell module 48 includes the capacitors 52a, 52b, 52c and the capacitors 54a, 54b, 54c, for a total of six capacitors, it may include more or less than the capacitors 52a, 52b, 52c and the capacitors 54a, 54b, 54c. Thus, the capacitance of the energy storage device 10, and consequently its energy capacity, may be adjusted by altering the sizes, number and/or capacitance of the capacitors 52a, 52b, 52c and the capacitors 54a, 54b, 54c.

Referring to FIGS. 3A and 3D, the center cradle 56 includes a first end 100 and a second end 102 opposite thereof, front and rear surfaces 104, 106 that extend from the first and second ends 100, 102, and first and second side surfaces 108, 110 that extend between the first and second ends 100, 102. A pair of circular-shaped channels 112a, 112b extends from the front surface 104 to the rear surface 106. The first end 100 of the center cradle 56 includes a first U-shaped channel 114a that extends from the front surface 104 to the rear surface 106, while the second end 102 of the center cradle 56 includes a second U-shaped channel 114b that extends from the front surface 104 to the rear surface 106. A slot 116a extends transversely across the first end 100, while a slot 116b extends transversely across the second end 102. A centrally positioned, threaded hole 118 is formed within the first U-shaped channel 114a at the first end 100, while a centrally positioned, threaded hole is formed within the U-shaped channel 114b at the second end 102 (not shown in the Figures).

Still referring to FIG. 3A, the first side surface 108 of the center cradle 56 includes a plurality of arc-shaped recesses 120a, 120b, 120c, while the second side surface 110 includes a plurality of arc-shaped recesses 122a, 122b, 122c. Each of the recesses 120a, 120b, 120c and the recesses 122a, 122b, 122c include a pair of rectangular-shaped cell cushions 124 that extend from the front surface 104 to the rear surface 106. Alternatively, the cushions 124 need not extend the full length from the front surface 104 to the rear surface 106. The cushions 124 may be made from a compressive material known in the art.

Figure 3B:
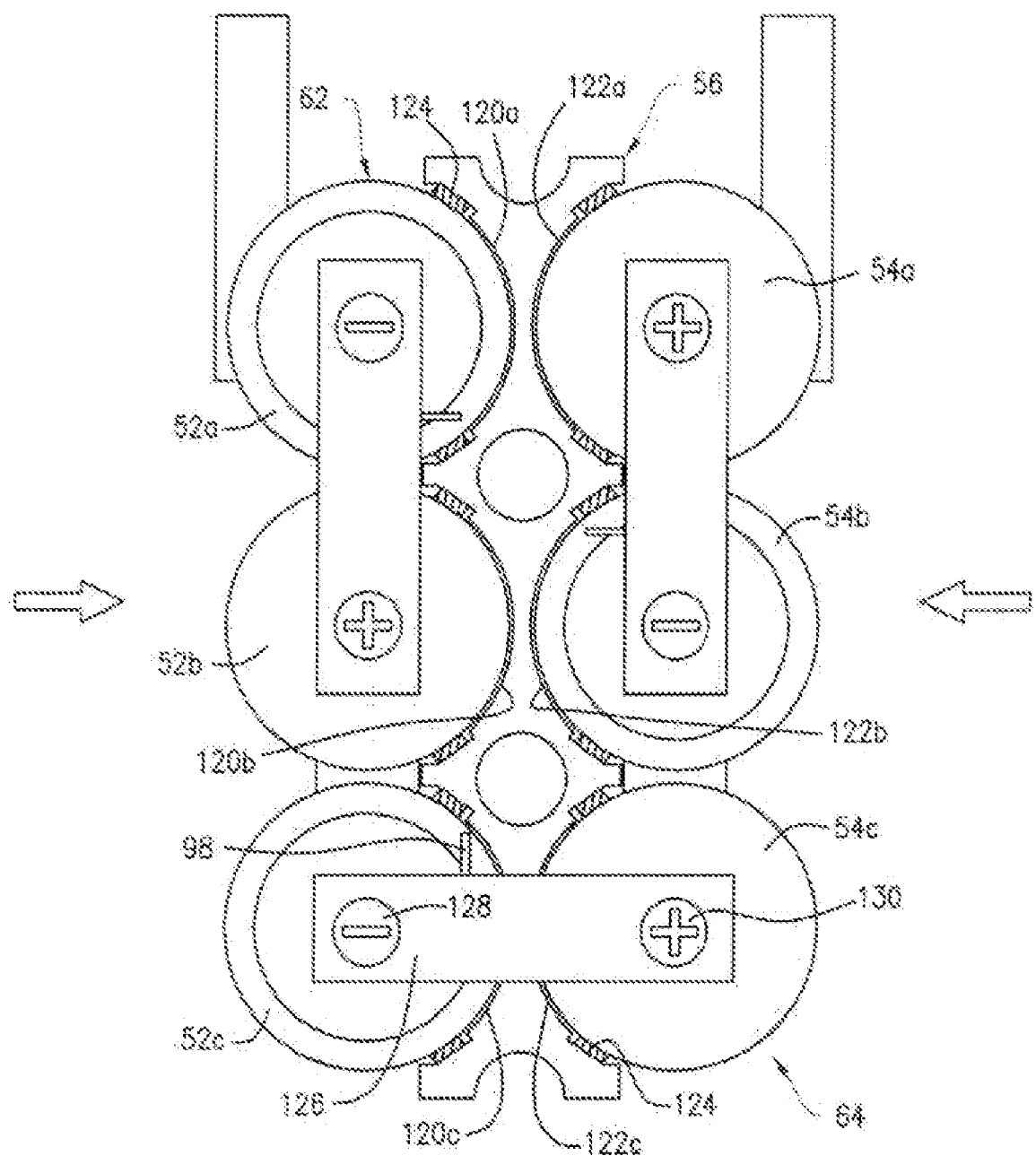
FIG. 3B is front elevational view of a center cradle and a plurality of capacitors employed by the cell module shown in FIG. 3A, the center cradle and the capacitors being assembled with one another.

As shown in FIG. 3B, the recesses 120a, 120b, 120c are sized and shaped to receive the outer curved surfaces of the capacitors 52a, 52b, 52c, respectively, while the recesses 122a, 122b, 120c are sized and shaped to receive the outer curved surfaces of the capacitors 54a, 54b, 54c, respectively. More particularly, the center cradle 56 is positioned intermediate the first and second columns 62, 64, which are compressed inwardly to ensure a snug fit with the center cradle 56. The cushions 124 protect the capacitors 52a, 52b, 52c and the capacitors 54a, 54b, 54c from being damaged during this step of the assembly process, as well as during further assembly and use of the energy storage device 10, such as, for example, vibration damage. The cushions 124 may provide nominal clearance between the capacitors and the recesses. After the center cradle 56 and the columns 62, 64 are assembled in the foregoing manner, a rectangular-shaped buss bar 126 is introduced to mechanically and electrically connect a negative terminal 128 of the capacitor 52c and a positive terminal 130 of the capacitor 54c. The buss bar 126 includes a monitoring terminal 98 that extends perpendicularly therefrom. Alternatively, the buss bar 126 may be connected to the capacitors 52c, 54c as described above prior to the assembly of the center cradle 56 with the columns 62, 64. In such a situation, the center cradle 56 may then be slid between the columns 62, 64.

Referring to FIGS. 3A and 3D, the outer cradle 58 includes a first end 132 and a second end 134 opposite thereof, front and rear surfaces 136, 138 that extend from the first and second ends 132, 134, a flat outer surface 140 and an inner surface 142 opposite thereof, which extend between the first and second ends 132, 134. The inner surface 142 includes a plurality of arc-shaped recesses 144a, 144b, 144c, each of which includes a rectangular-shaped cell cushion 146 that extends from the front surface 136 to the rear surface 138 (not shown in FIGS. 3A and 3D, but see FIG. 3C). Alternatively, the cushions 146 need not extend the full length from the front surface 136 to the rear surface 138. Like the cushions 124, the cushions 146 may be made from a compressive material known in the art. The first end 132 of the outer cradle 58 includes a slot 148, a pair of tabs 150a, 150b extending therein, and a centrally positioned, threaded hole 152. The second end 134 of the outer cradle 58 includes a slot 154 and a centrally positioned, threaded hole (not shown in the Figures).

Similarly, the second substrate 60 includes a first end 156 and a second end 158 opposite thereof, front and rear surfaces 160, 162 that extend from the first and second ends 156, 158, a flat outer surface 164 and an inner surface 166 opposite thereof, which extend between the first and second ends 158, 160. The inner surface 166 includes a plurality of arc-shaped recesses 168a, 168b, 168c, each of which includes a rectangular-shaped cell cushion 170 that extends from the front surface 160 to the rear surface 162. Once again, the cushions 170 need not extend the full length from the front surface 160 to the rear surface 162, and may be made from a compressive material known in the art. The first end 156 of the substrate 60 includes a slot 172, a pair of tabs 174a, 174b extending therein, and a centrally positioned, threaded hole 176. The second end 158 of the substrate 60 includes a slot 178 and a centrally positioned, threaded hole (not shown in the Figures).

As shown in FIG. 3C, the recesses 144a, 144b, 144c of the outer cradle 58 are sized and shaped to receive the exposed, curved outer surfaces of the capacitors 52a, 52b, 52c, respectively, while the recesses 168a, 168b, 168c of the outer cradle 60 are sized and shaped to receive the exposed, curved outer surfaces of the capacitors 54a, 54b, 54c, respectively. More particularly, the outer cradle 58 is juxtaposed with the capacitors 52a, 52b, 52c and the outer cradle 60 is juxtaposed with the capacitors 54a, 54b, 54c, and the outer cradles 58, 60 are then compressed towards each other to ensure a snug fit. The cell cushions 146, 170 protect the capacitors 52a, 52b, 52c and the capacitors 54a, 54b, 54c, respectively, from being damaged during this step of the assembly process, as well as during further assembly and use of the energy storage device 10, such as, for example, vibration damage. The cushions 146, 170 may provide nominal clearance between the capacitors 52a, 52b, 52c and 54a, 54b, 54c and the cradles 58, 60, respectively.

Figure 4A:
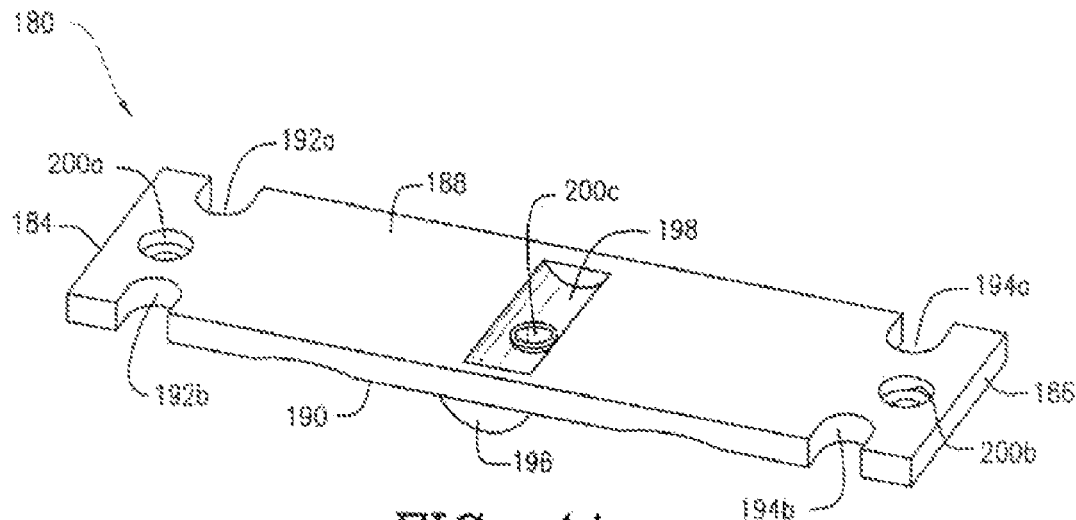
FIGS. 4A and 4B show top perspective views of upper and lower retaining structures, respectively, employed by the cell module shown in FIG. 3A.
Figure 4B:
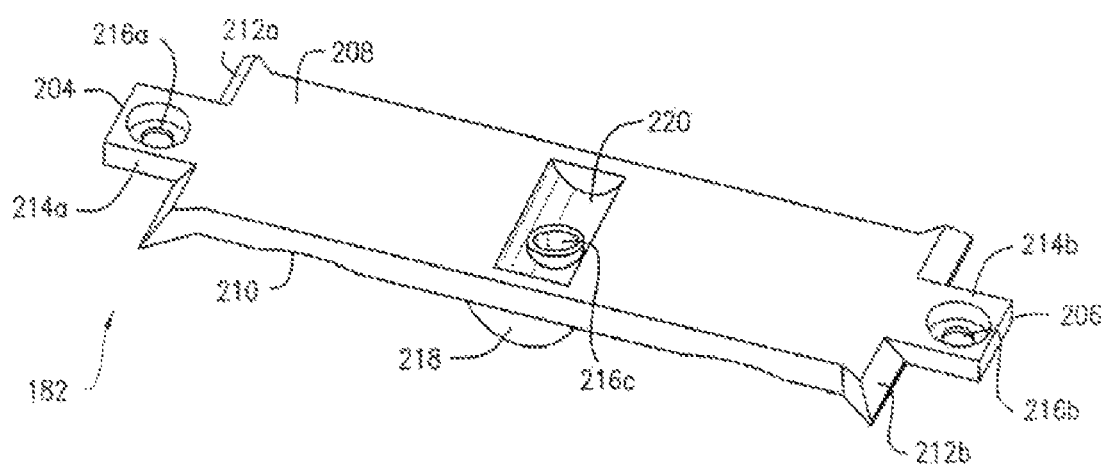

Referring to FIG. 4A and 4B, the first cell module 48 further includes a substantially rectangular-shaped upper retaining structure 180 and a substantially rectangular-shaped lower retaining structure 182. As described in further detail below, the retaining structures 180, 182 secure the capacitors 52a, 52b, 52c, the capacitors 54a, 54b, 54c, the center cradle 56 and the outer cradles 58, 60 to one another.

With particular reference to FIG. 4A, the upper retaining structure 180 includes a first end 184 and second end 186 opposite thereof, and a first surface 188 and a second surface 190 opposite thereof which extend from the first and second ends 184, 186. A first pair of opposed U-shaped slots 192a, 192b are formed proximate to the first end 184 and extend from the first surface 188 to the second surface 190, while a pair of opposed U-shaped slots 194a, 194b are formed proximate to the second end 186 and extend from the first surface 188 to the second surface 190. A centrally positioned, U-shaped tab 196 extends transversely across and outwardly from the second surface 190, while a centrally positioned groove 198 is formed transversely across and within the first surface 188 and is generally aligned with the tab 196. A pair of screw holes 200a, 200b are positioned proximate to the first and second ends 184, 186, respectively, an extend from the first surface 188 to the second surface 190, while a centrally positioned screw hole 200c is formed within the groove 198 and extends from the first surface 188 to the second surface 190 through the tab 196.

Figure 4C:
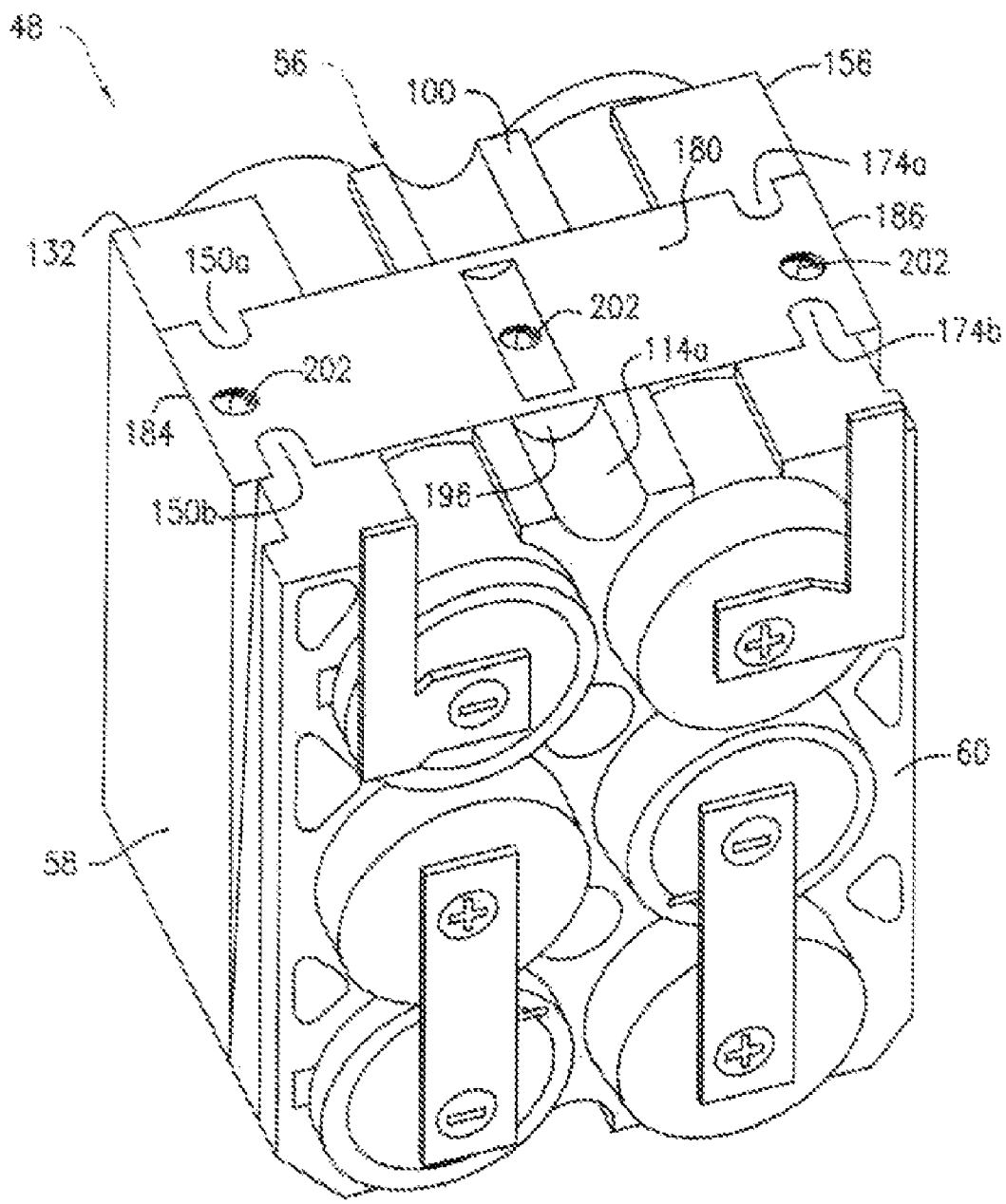
FIGS. 4C and 4D are top and bottom perspective views of the fully assembled cell module.

Referring to FIG. 4C, the upper retaining structure 180 is mounted to the first end 100 of the center cradle 56, the first end 132 of the outer cradle 58, and the first end 156 of the outer cradle 60. More particularly, the slot 148 of the substrate 58 is sized and shaped to receive the first end 184 of the retaining structure 180, whereby the tabs 150a, 150b of the substrate 58 are received within the slots 192a, 192b of the retaining structure 180, respectively. Similarly, the slot 172 of the substrate 60 is sized and shaped to receive the second end 186 of the retaining structure 180, whereby the tabs 174a, 174b of the substrate 60 are received within the slots 194a, 194b of the retaining structure 180, respectively. At the same time, the channel 114a of the center cradle 56 is sized and shaped to receive the tab 196 of the retaining structure 180. In this position, the screw holes 200a, 200b, 200c are aligned with the hole 152 of the substrate 58, the hole 176 of the substrate 60, and the hole 118 of the center cradle 56, respectively. Screws 202 are inserted through each of the foregoing holes to secure the retaining structure 180. The groove 198 enables the screw 206 that is inserted within the hole 200c to be flush with the surface 188.

With particular reference to FIG. 4B, the lower retaining structure 182 includes a first end 204 and second end 206 opposite thereof, and a first surface 208 and a second surface 210 opposite thereof which extend from the first and second ends 204, 206. The end 204 includes an angled projection 212a while the end 206 includes an angled projection 212b, each of which extends outwardly from the second surface 210. The end 204 includes a square-shaped tab 214a while the end 206 includes a square-shaped tab 214b, each of which extends outwardly. The tabs 214a, 214b include circular-shaped holes 216a, 216b, respectively. A centrally positioned, U-shaped tab 218 extends transversely across and outwardly from the second surface 210, while a centrally positioned groove 220 is formed transversely across and within the first surface 208 and is generally aligned with the tab 218. A centrally positioned screw hole 216c is formed within the groove 220 and extends from the first surface 208 to the second surface 210 through the tab 218.

Figure 4D:
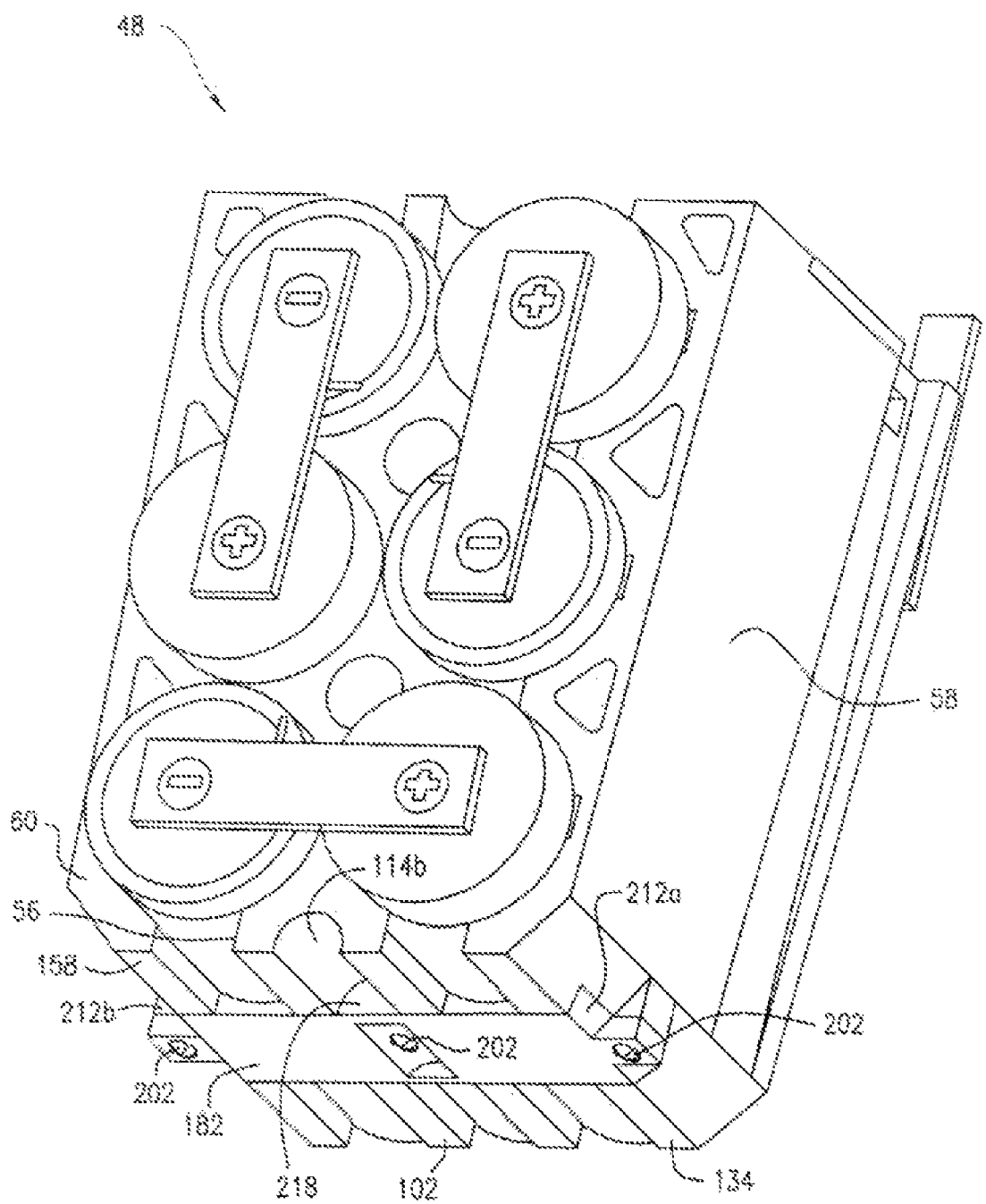

As shown in FIG. 4D, the lower retaining structure 182 is mounted to the second end 102 of the center cradle 56, the second end 134 of the outer cradle 58, and the second end 158 of the outer cradle 60. More particularly, the slots 154, 178 of the substrates 58, 60 are sized and shaped to receive the projections 212a, 212b, respectively. At the same time, the channel 114b of the center cradle 56 is sized and shaped to receive the tab 218 of the retaining structure 182. In this position, the holes 216a, 216b, 216c are aligned with the hole of the outer cradle 58 at the second end 134 (not shown), the hole of the outer cradle 60 at the second end 158 (not shown), and the hole of the center cradle 56 at the second end 102 (not shown), respectively. Additional screws 202 are inserted through each of the foregoing holes to secure the retaining structure 182 (see FIG. 4D). The groove 220 enables the screw 206 inserted within the hole 216c to be flush with the surface 210.

It is noted that the center cradle 56, the outer cradles 58, 60, and the retaining structures 184, 186 are each manufactured from an insulating material, such as a thermoplastic, polymeric material. In this regard, such components can be manufactured from the same materials as those of the housing 12. However, the center cradle 56, the outer cradles 58, 60, and the retaining structures 184, 186 may be made from other suitable materials known in the art to suit the purposes of the varied configurations to be appreciated from the teachings herein.

Figure 5:
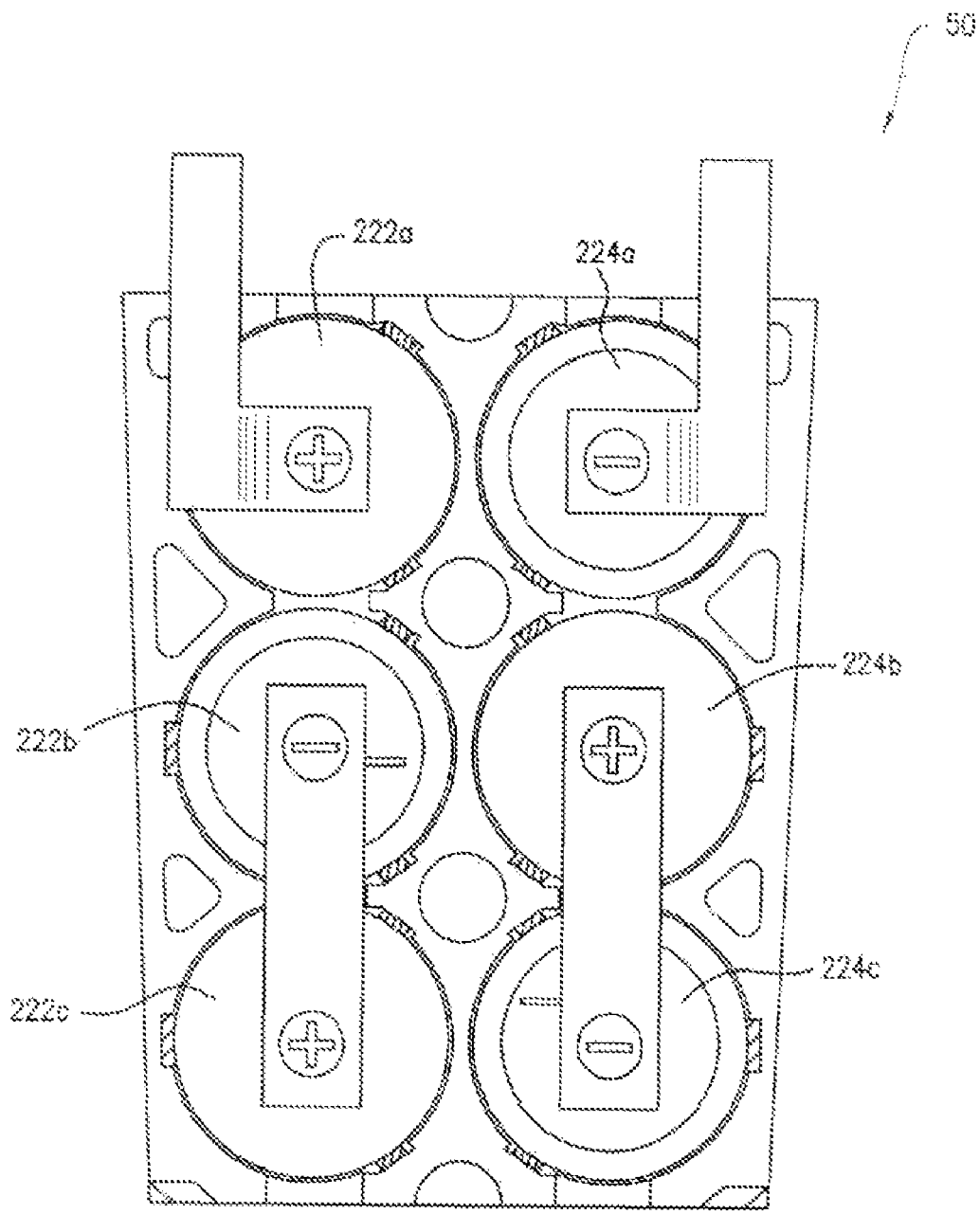
FIG. 5 is a front elevational view of a second fully assembled cell module employed by the energy storage device shown in FIG. 1.

FIG. 5 shows the second cell module 50, which is virtually identical to the first cell module 48. More particularly, the second cell module 50 includes the same components as those of the first cell module 48 and is assembled in the same manner as the first cell module 48 as described above, with one notable exception. That is, the positions of the positive and negative terminals of each of capacitors 222a, 222b, 222c and capacitors 224a, 224b, 224c of the second cell module 50 are reversed from those of the corresponding capacitors 52a, 52b, 52c and 54a, 54b, 54c of the first cell module 48.

Referring to FIG. 6, once the first and second cell modules 48, 50 are assembled as described above, a plurality of female terminals 226 are crimped to corresponding wires 228 and connected to the monitoring terminals 98. An adhesive may be used to help retain the terminals 226 on the monitoring terminals 98 (not shown in the Figures). The wires 228 can be routed through either or both of the channels 112a, 112b of the center cradle 56. Preferably, the female terminals 226 consist of Molex MX150 Series 1.5 mm terminals, while the wires 228 are 18 gage wire. Alternatively, the terminals 226 may consist of other types and sizes of terminals, and the wires 228 may have other gauges.

With continued reference to FIG. 6, installation of the cell modules 48, 50 within the housing 12 is shown. More particularly, the cell module 50 is inserted into the first chamber 30 of the housing 12, while the cell module 48 is inserted into the second chamber 32 of the housing 12. The posts 38 assist in securing the cell modules 48, 50 within the chambers 32, 30. Once the cell modules 48, 50 are installed within the housing 12, a particular routing path of the wires 228 may be chosen to suit the particular application for the energy storage device 10. When the cell modules 48, 50 are positioned within the housing 12, the L-shaped terminal 78, which is connected to the capacitor 52a, is juxtaposed with an L-shaped terminal 230 connected to the capacitor 224a, while the L-shaped terminal 94, which is connected to the capacitor 54a, is juxtaposed with an L-shaped terminal 232 connected to the capacitor 222a.

The total capacitance of the energy storage device 10 may be increased by adding cell modules in addition to the cell modules 48, 50 (not shown in the Figures), so long as the housing 12 is sized and shaped to accommodate receipt of same. Although the energy storage device 10 includes the two cell modules 48, 50, it may include less or more than the cell modules 48, 50.

By way of example, the capacitors 52*a-c*, 54*a-c*, 226*a-c*, 228*a-c* can provide for a storage voltage capacity in the range from about 12.0 volts to about 16.0 volts, and between about 19 kilojoules to about 90 kilojoules of energy. Alternatively, the capacitors 52*a-c*, 54*a-c*, 226*a-c*, 228*a-c* can provide for other storage voltage amounts (e.g., 24 volts, 42 volts, etc.) and other energy storage amounts. The capacitors 52*a-c*, 54*a-c*, 226*a-c*, 228*a-c* are connected in series with one another, but they may be connected in parallel with one another to suit the purposes of the varied configurations to be appreciated from the teachings herein.

The capacitors 52*a-c*, 54*a-c*, 226*a-c*, 228*a-c* store an engine start voltage, which is a voltage that is sufficient to crank an internal combustion engine for at least one start cycle. The internal combustion engine may be a 5.9L to 9.3L diesel engine, in which an engine start cycle includes a crank time of about three to five seconds by way of example. Alternatively, the energy storage device 10 may be utilized with any engine type (e.g., gasoline engines, etc.) or size (e.g., 16.0L engines, etc.), and for various engine start cycles and crank times.

Figure 7B:
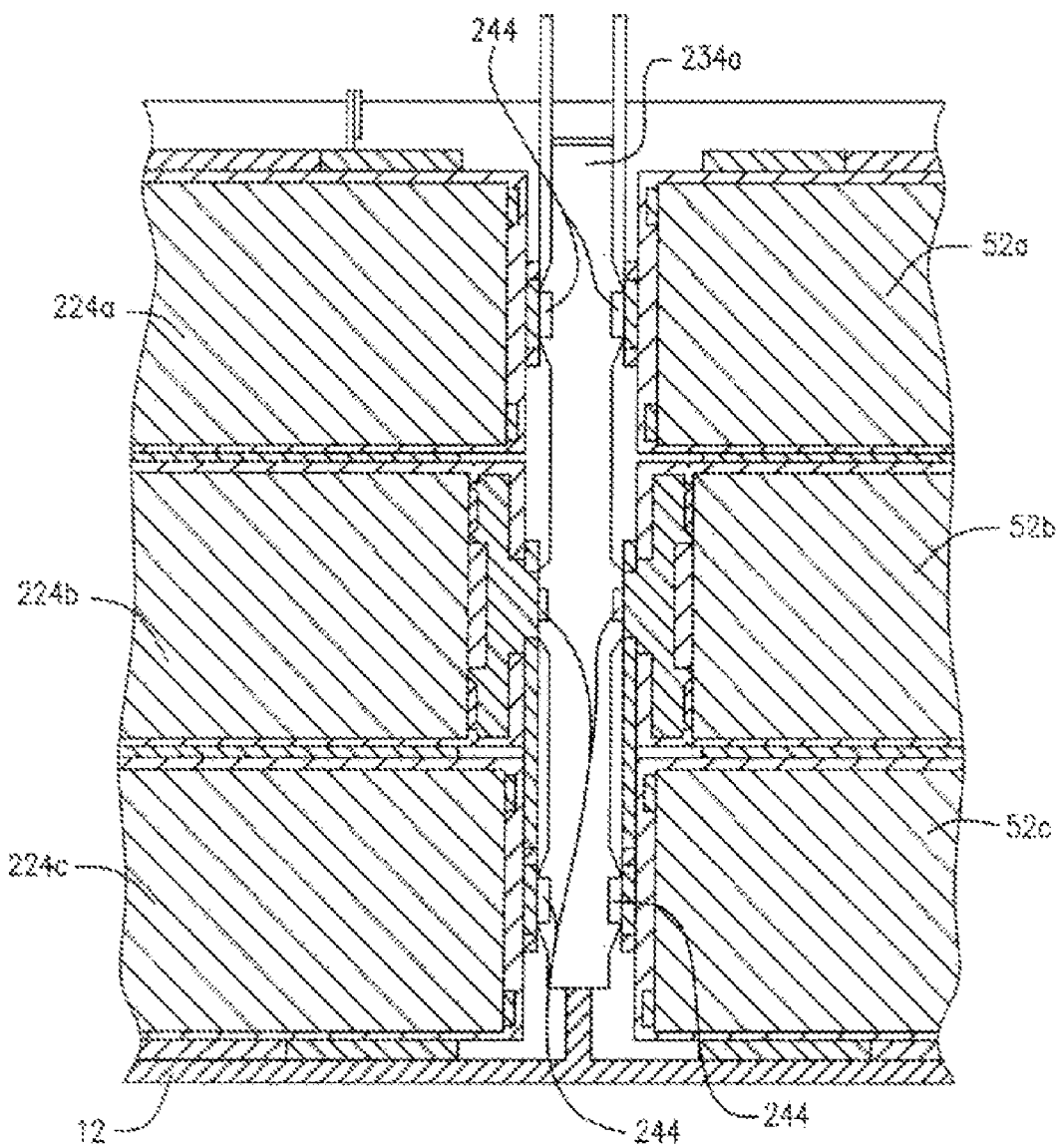
FIG. 7B is a cross-sectional view of the assembly shown in FIG. 6A, taken along lines 1-1 and looking in the direction of the arrows, showing a retaining module being fully inserted therein.

Referring to FIGS. 7A and 7B, the energy storage device 10 includes a pair of elongated cell module retainers 234*a*, 248*b*, each having an H-shaped cross-section. More particularly, each of the retainers 234*a*, 234*b* includes a first end 236 and a second end 238 opposite thereof, a pair of elongated rectangular-shaped portions 240*a*, 240*b*, and an elongated cross member 242 that connects the portions 240*a*, 240*b*. Each of the portions 240*a*, 240*b* includes a plurality of projections 244 that extend outwardly therefrom and are spaced apart from one another. A pair of opposed rectangular-shaped slots 246 extend from the first end 236 to the second end 238 between the portions 240*a*, 240*b*.

As shown in FIGS. 7A and 7B, the second end 238 of the retainer 234*a* is inserted into the slot 26*a* of the dividing wall 24 of the housing 12, such that portions of the wall 24 are received within the slots 246 so as to prevent lateral movement of the retainer 234*a*. The retainer 234*a* may initially be partly inserted into the slot 26*a* to allow for adjustment of the cell modules 48, 50 into their desired positions within the housing 12. When the retainer 234*a* is fully inserted into the slot 26*a*, each of the projections 244 is aligned and juxtaposed with a corresponding terminal of the capacitors 52*a*, 52*b*, 52*c* and the capacitors 224*a*, 224*b*, 224*c*. The projections 244 prevent the capacitors 52*a*, 52*b*, 52*c* and the capacitors 224*a*, 224*b*, 224*c* from shifting laterally. The retainer 234*b* is inserted into the slot 26*b* of the dividing wall 24 in a similar manner as that of the retainer 234*a*. When fully installed, the retainers 234*a*, 238*b* help lock the cell modules 48, 50 into position and keep them from moving substantially within the housing 12.

The retainers 234*a*, 234*b* are, preferably, manufactured from an insulating material, such as a polymeric, thermoplastic material. The retainers 234*a*, 238*b* may be made from the same materials as those of the housing 12. Alternatively, the retainers 234*a*, 234*b* may be made from other suitable materials known in the art.

Figure 8A:
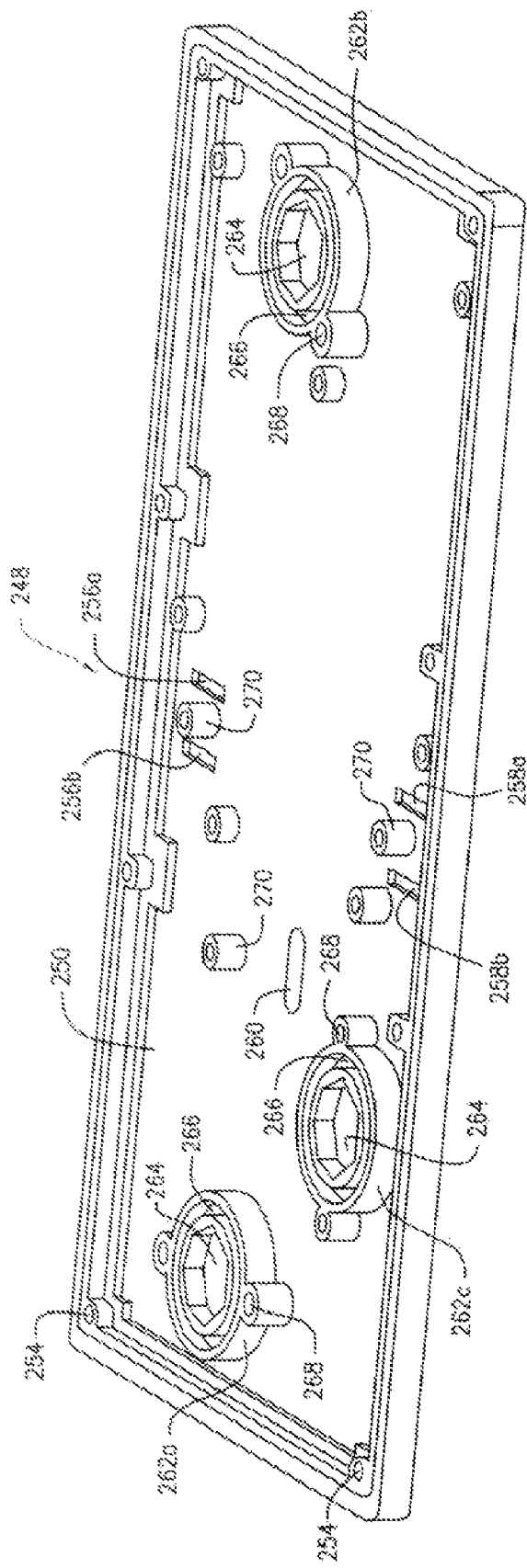
FIGS. 8A and 8B are top and bottom perspective views of an isolation plate employed by the energy storage device shown in FIG. 1.
Figure 8B:
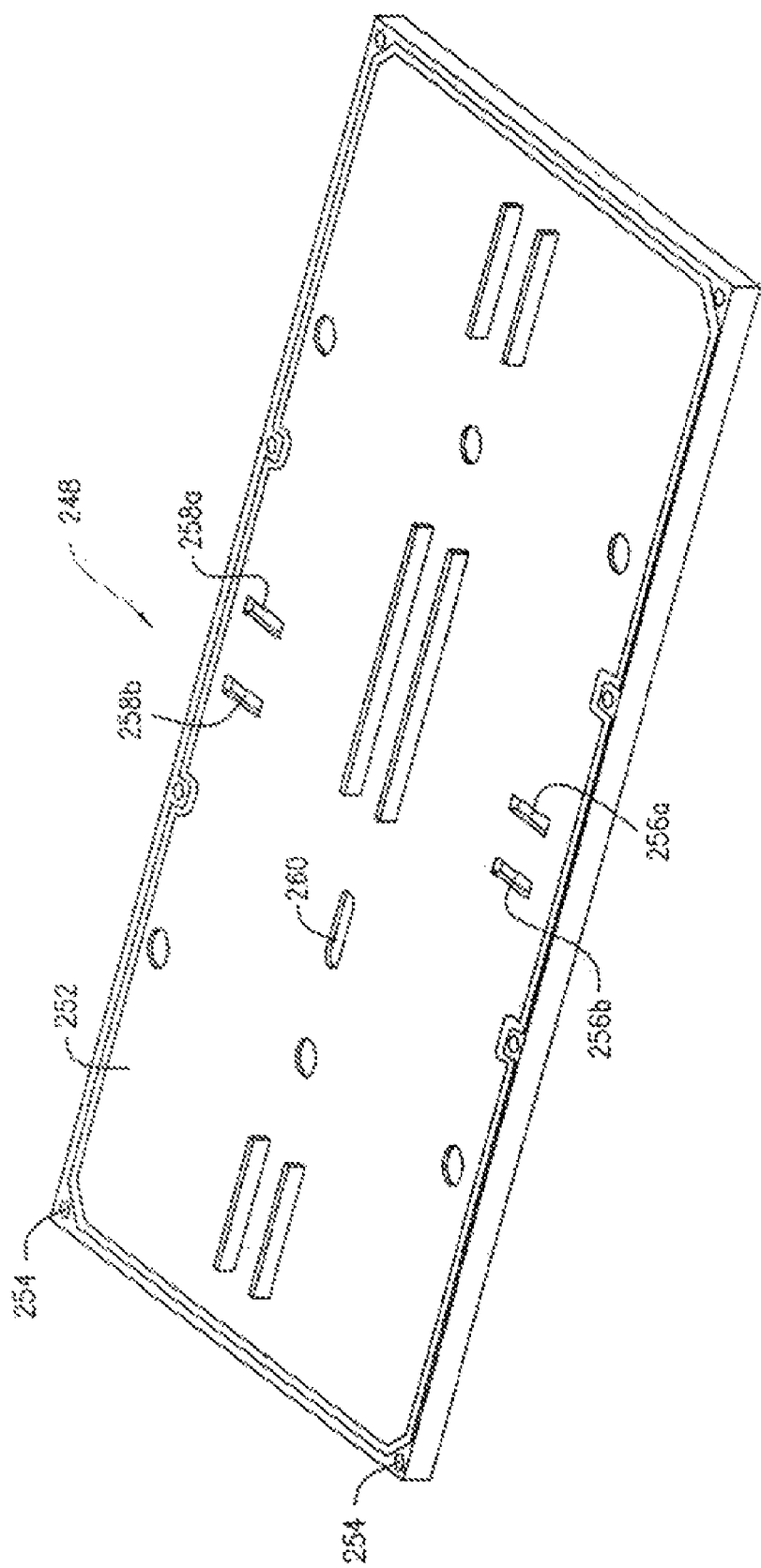

Referring to FIGS. 8A and 8B, the energy storage device 10 includes a rectangular-shaped isolation plate 248 having a first surface 250 and a second surface 252 opposite thereof, and a plurality of circular shaped holes 254 formed around the perimeter of the plate 248. Each of the holes 254 extends from the first surface 250 to the second surface 252. The plate 248 includes a first pair of rectangular-shaped apertures 256*a*, 256*b* that are positioned parallel to one another and extend from the first surface 250 to the second surface 252 of the plate 248, and a second pair of rectangular-shaped apertures 258*a*, 258*b* that are positioned parallel to one another and extend from the first surface 250 to the second surface 252 of the plate 248. A rectangular-shaped aperture 260 extends from the first surface 250 to the second surface 252 of the plate 248 and is positioned offset from the apertures 256*a*, 256*b* and the apertures 258*a*, 258*b*. With particular reference to FIG. 8A, the first surface 250 of the plate 248 includes three stud holders 262*a*, 262*b*, 262*c*, each having a hexagonal-shaped recess 264, a circular-shaped groove 266 that surrounds the recess 264, and a pair of diametrically opposed screw holes 268. A plurality of apertured posts 270 extend outwardly from the first surface 250 of the plate 248.

Figure 8C:
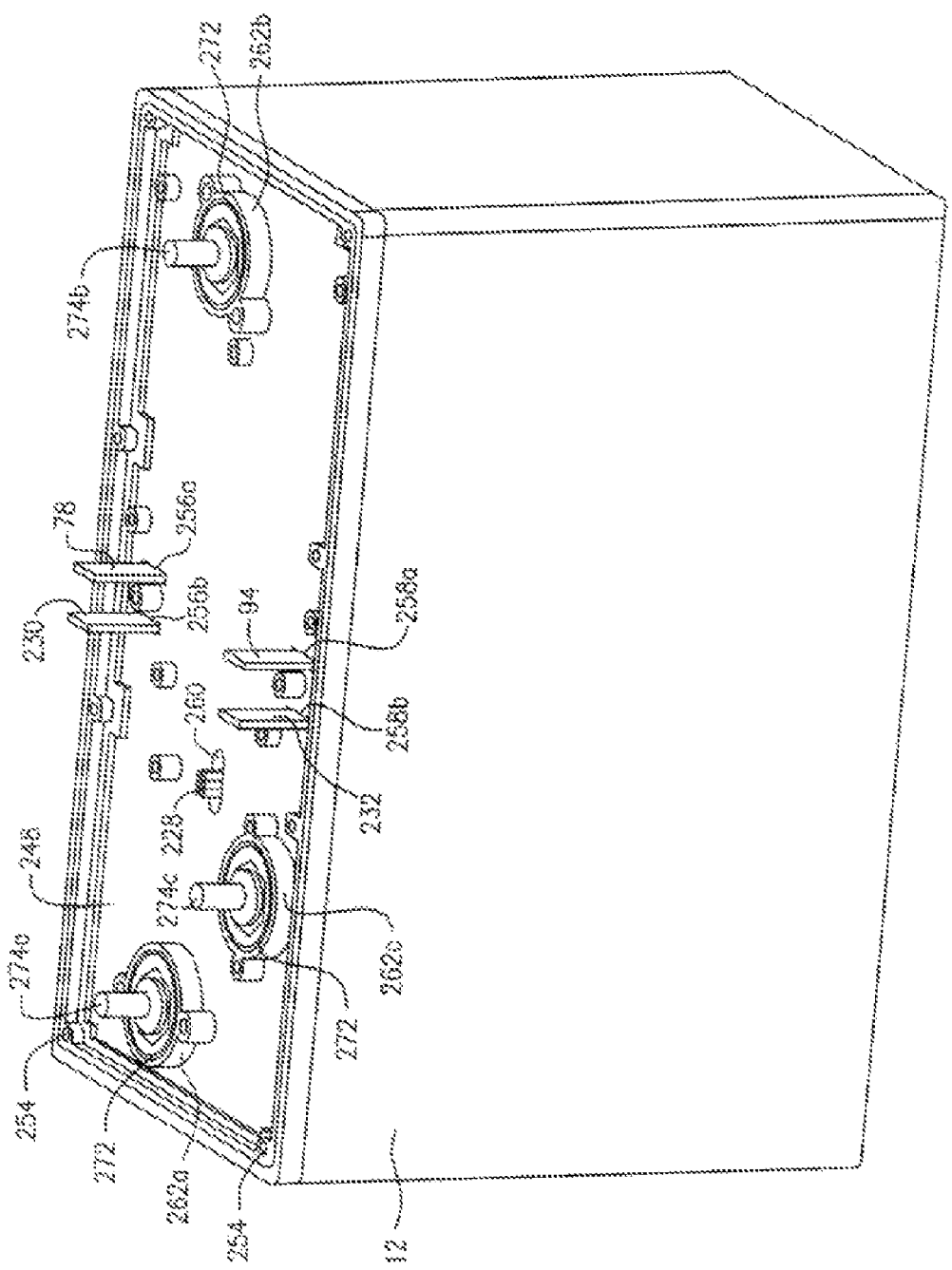
FIG. 8C is a top perspective view of the isolation plate shown in FIG. 8A mounted to the housing shown in FIG. 2A and studs mounted to the plate.

Referring to FIG. 8C, the plate 248 is sized and shaped to be installed on the ridge 34 of the housing 12. A seal may be placed on the second surface 252 of the plate 248 along the perimeter thereof prior to such installation (not shown in the Figures). The seal may consist of a gasket, a sealing adhesive, or combination thereof. When the plate 248 is installed on the housing 12, each of the holes 254 of the plate 248 align with a corresponding one of the threaded inserts 44 of the housing 12. Screws may be temporarily installed in the holes 254 and corresponding threaded inserts 44 to temporarily secure the plate 248 while assembling some of the remaining components of the energy storage device 10 (not shown in the Figures). When the plate 248 is installed, the free ends of the L-shaped terminals 78, 230 protrude through the apertures 256*a*, 256*b*, respectively, while the free ends of the L-shaped terminals 94, 232 extend through the apertures 258*a*, 258*b*, respectively. The wires 228 are routed through the aperture 260.

The plate 248 is preferably manufactured from a heat-resistant, thermally insulating material, such as a polymeric material. An example of a polymeric material that may be suitable for manufacturing the plate 248 includes, but is not limited to, a thermoplastic material. Alternatively, the plate 248 may be made from other suitable materials known in the art to suit the purposes of the varied configurations to be appreciated from the teachings herein.

With continued reference to FIG. 8C, O-rings 272 are installed in each of the grooves 266 of the stud holders 262*a*, 262*b*, 262*c*, while studs 274*a*, 274*b*, 274*c* are installed within the recesses 264 thereof. Each of the studs 274, 274*b*, 274*c* is sized and shaped as a standard motor vehicle battery stud, such as a ⅜-16 UNC stud, but other types of studs having different shapes and sizes may be utilized. While the energy storage device 10 includes the studs 274*a*, 274*b*, 274*c*, it may include more or less studs.

Figure 9A:
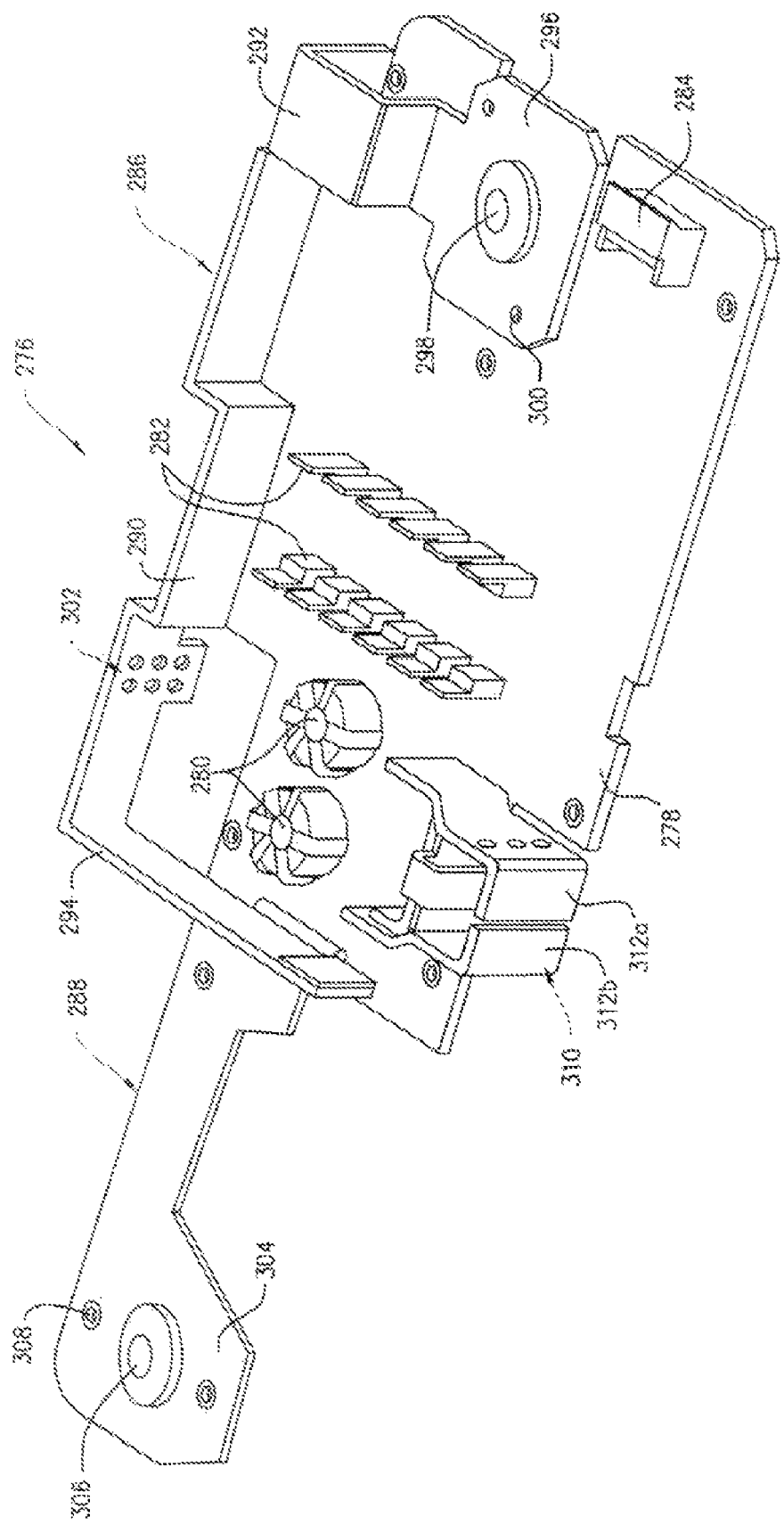
FIG. 9A shows a top perspective view of a DC-DC converter assembly employed by the energy storage device shown in FIG. 1.

Referring to FIG. 9A, the energy storage device 10 includes a DC-DC converter 276 having a printed circuit board 278. Mounted to the printed circuit board 278 are a plurality of inductors (i.e., coils) 280, a plurality of switching devices 282, a cell balancing connector 284, a first buss assembly 286 and a second buss assembly 288. The first buss assembly 286 includes a base 290, a first arm 292 extending from one end of the base 290, and a second arm 294 extending from an opposite end of the base 290. The first arm 292 includes a stud connector 296 having a centrally located stud hole 298 and a pair of opposed screw holes. A mounting portion 302 is formed on the base intermediate the arms 292, 294. The second buss assembly 288 includes a stud connector 304 having a centrally located stud hole 306 and a pair of opposed screw holes 308. The first and second buss assemblies 286, 288 are in electrical communication with one another. The DC/DC converter 276 further includes a connector 310 formed from two L-shaped members 312a, 312b.

The term "DC-DC converter" is generally known to include a circuit that converts a source of direct current from one voltage to a second voltage. The source of direct current can be from a motor vehicle battery (not shown in the Figures). With respect to the present invention, the DC-DC converter 288 can be a step up unidirectional converter that can increase the stored voltage of the capacitors 52a-c, 54a-c, 222a-c, 224a-c to as high as approximately 16.0 volts, but the converter 276 can increase the stored voltage to an amount less or greater than 16.0 volts. By way of example, the DC-DC converter 276 may provide sufficient voltage to the capacitors 52a-c, 54a-c, 222a-c, 224a-c to start an internal combustion engine that typically requires a 12 volt start voltage from a battery that has been discharged down to 8 volts. Alternatively, the DC-DC converter 276 may provide other voltage amounts that may be required to start the engine.

It is noted that the above description refers to a step up unidirectional converter, but the DC-DC converter 276 may be any converter or device that has the ability to step up voltage. The DC-DC converter 276 controls charge voltage by applying a DC voltage from the motor vehicle's battery across the inductors 280 for a period of time, which causes current to flow through the inductors 280 that stores energy magnetically, and then by switching the voltage off, the stored energy is transferred as voltage output to the capacitors 52a-c, 54a-c, 222a-c, 224a-c, wherein by adjusting the on/off time of the voltage across the inductors 280, the voltage output can be regulated.

The DC-DC converter 276 includes a control system having, but not limited to, voltage monitoring capabilities from a cell balancing circuit and capacitor temperature monitoring circuitry. The system keep the capacitors 52a-c, 54a-c, 222a-c, 224a-c at a safe and balanced charge state based on monitoring of systematic and environmental conditions. For example, the control system can regulate the charging rate of the capacitors 52a-c, 54a-c, 222a-c, 224a-c to provide a charge from about 8 volts to about 16 volts in a reasonable amount of time; disable actuation of the engine start system when the voltage of the capacitors 52a-c, 54a-c, 222a-c, 224a-c is less than about 8 volts; disable charging of the capacitors 52a-c, 54a-c, 222a-c, 224a-c when the temperature thereof exceeds, for example, approximately 65° C.; and disable the starter motor engagement after a predetermined time period in order to avoid overheating.

In addition, the difference in stored voltage by the capacitors 52a-c, 54a-c, 222a-c, 224a-c may be the result of leakage current. The voltage may be equalized by placing a bypass resistor in parallel with each of the capacitors 52a-c, 54a-c, 222a-c, 224a-c, wherein the current through the resistor dominates the total cell leakage current (not shown in the Figures). Alternatively, the bypass resistor need not be included. Communication with the control system for performing the aforesaid cell balancing functions may be made via the cell balancing connector 284. It is noted that the above examples for monitoring and balancing the voltage distribution of the capacitors 52a-c, 54a-c, 222a-c, 224a-c is provided for illustrative purposes only and is not intended to limit the present invention, since any balancing circuitry has been contemplated and is within the scope of the present invention.

The switching devices 282 are used to control the current flowing through the DC-DC converter 276. In one embodiment of the present invention, the switching devices 282 may be transistors, such as field effect transistors (FETs). However, the switching devices 282 may consist of other components known in the art that perform the same function.

Figure 9B:
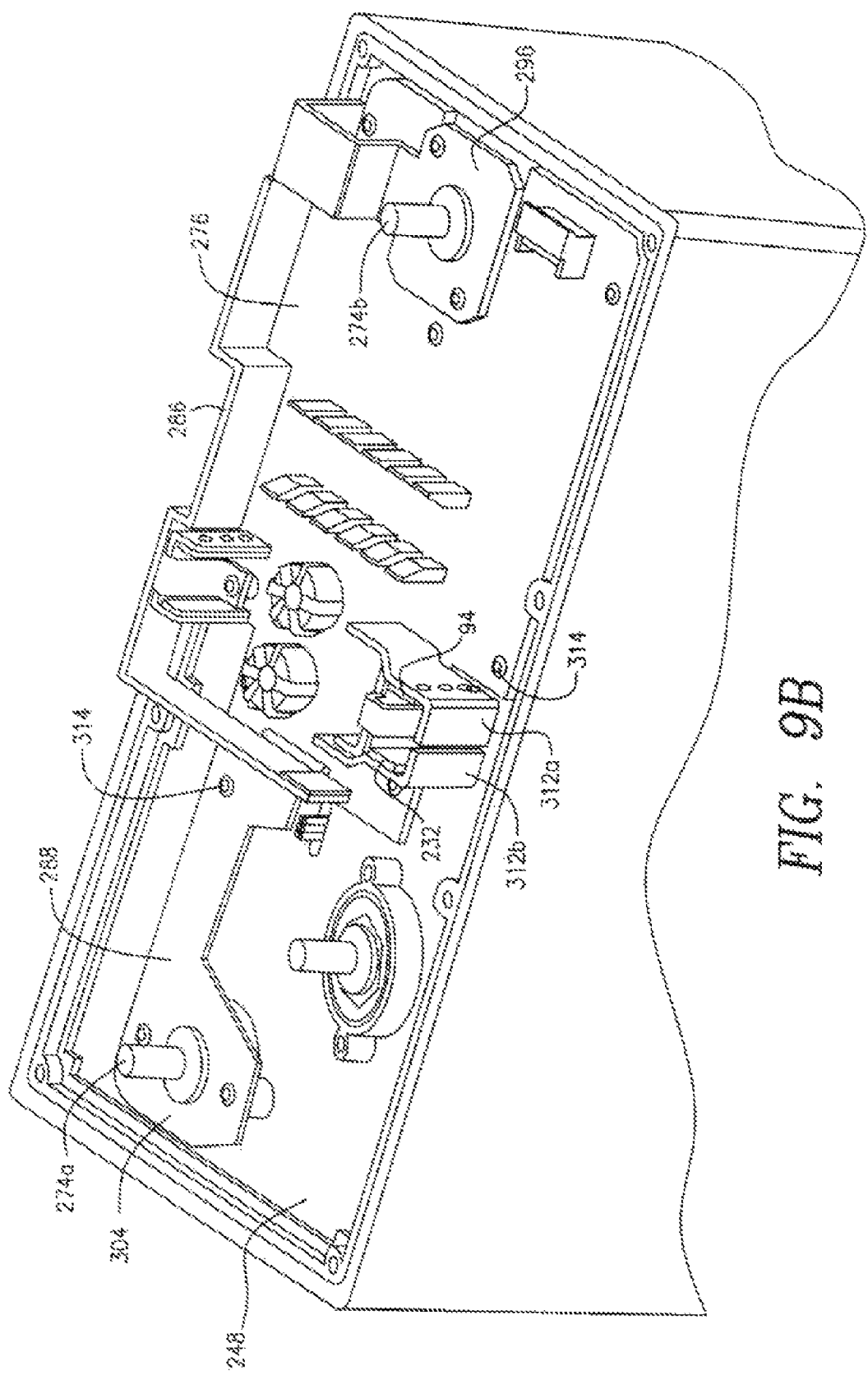
FIG. 9B shows a top perspective view of the DC-DC converter assembly shown in FIG. 9A mounted to the isolation plate shown in FIG. 8C.

Referring to FIG. 9B, the DC/DC converter 276 is mounted to the plate 248 by screws 314 via the threaded posts 270. In this manner, the stud connector 296 of the first buss assembly 286 is fitted over the stud 274b via the stud hole 298 and mounted to the stud holder 262b by screws via the screw holes 268 and screw holes 300. Similarly, the stud connector 304 of the second buss assembly 288 is fitted over the stud 274a via the stud hole 306 and mounted to the stud holder 262a by screws via the screw holes 268 and the screw holes 308. The members 312a, 312b of the connector 310 are mounted to the L-shaped terminals 94, 232 by laser welding, but other means known in the art to connect these components may be utilized.

Figure 9C:
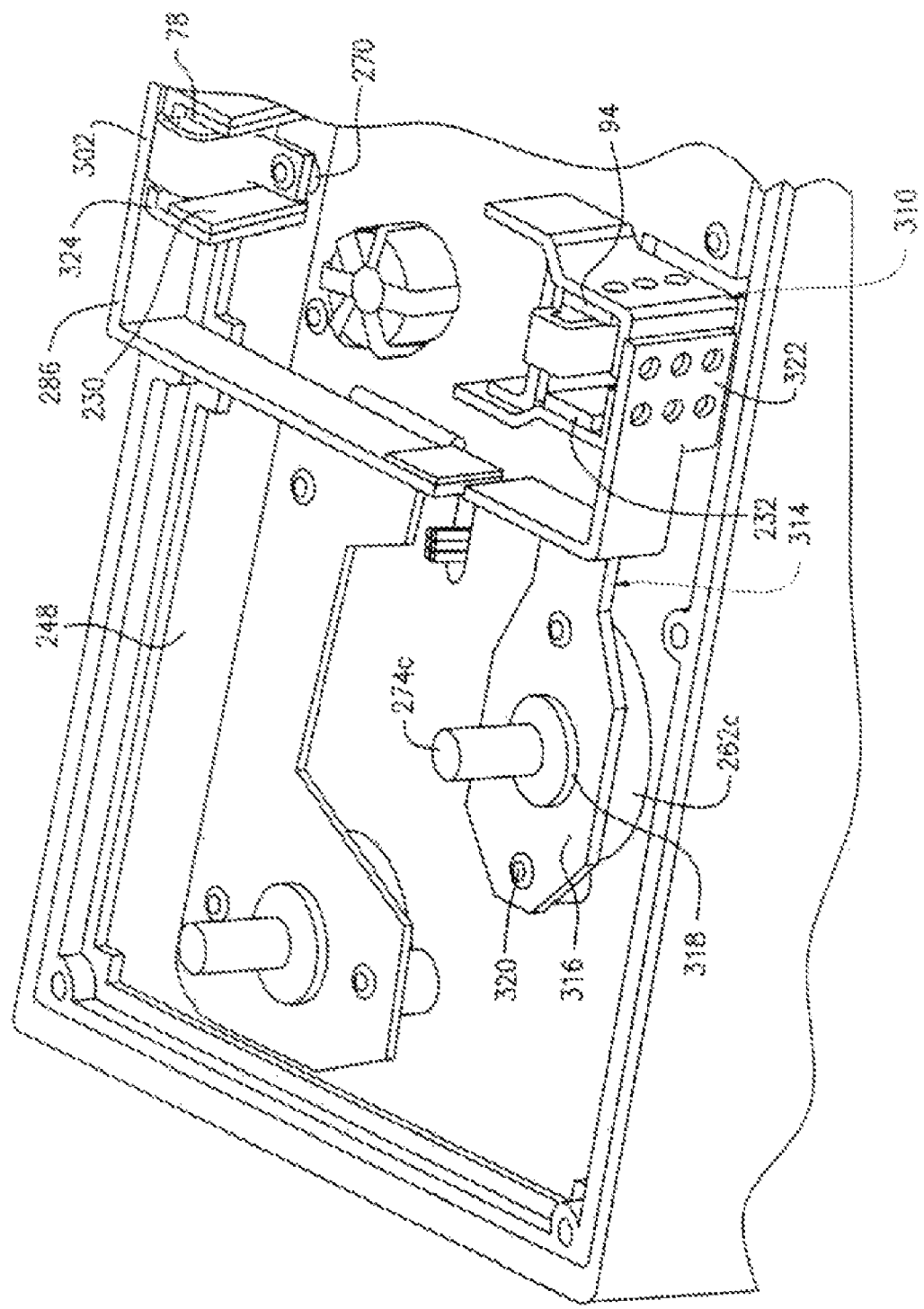
FIG. 9C shows a partial, top perspective view of the DC-DC converter assembly shown in FIG. 9B with a buss employed thereby attached to a terminal.

Referring to FIG. 9C, a third buss assembly 314 includes a stud connector 316 having a stud hole 318 and screw holes 320 at one end thereof. The stud connector 316 is fitted over the stud 274c via the stud hole 318 and mounted to the stud holder 262c by screws via the screw holes 274 and the screw holes 320. An opposite end of the third buss assembly 314 includes a mounting portion 322 that is connected to the connector 310 by laser welding them to one another, which results in the L-shaped terminals 94, 232 being connected electrically to one another. A U-shaped cell connector 324 is mounted to one of the posts 270 of the plate 248 and then laser welded to the L-shaped terminals 78, 230 which results in the L-shaped terminals 78, 230 being connected electrically to one another. The mounting portion 302 of the first buss assembly 286 is then joined with the cell connector 324 by laser welding them to one another. With the foregoing components assembled in this fashion, electrical connectivity is provided between the DC/DC converter 276 and of the capacitors 52a-c, 54a-c, 226a-c, 228a-c. Thus, the connector 310 represents a net positive terminal of the capacitors 52a-c, 54a-c, 226a-c, 228a-c, while the connector 324 represents the net negative terminal of the capacitors 52a-c, 54a-c, 226a-c, 228a-c.

The buss assemblies 286, 288, 314 and the connectors 310, 324 are made from an electrically conductive material, such as aluminum or tin-plated copper. Alternatively, such components can be made from other electrically conductive materials known in the art.

Figure 10A:
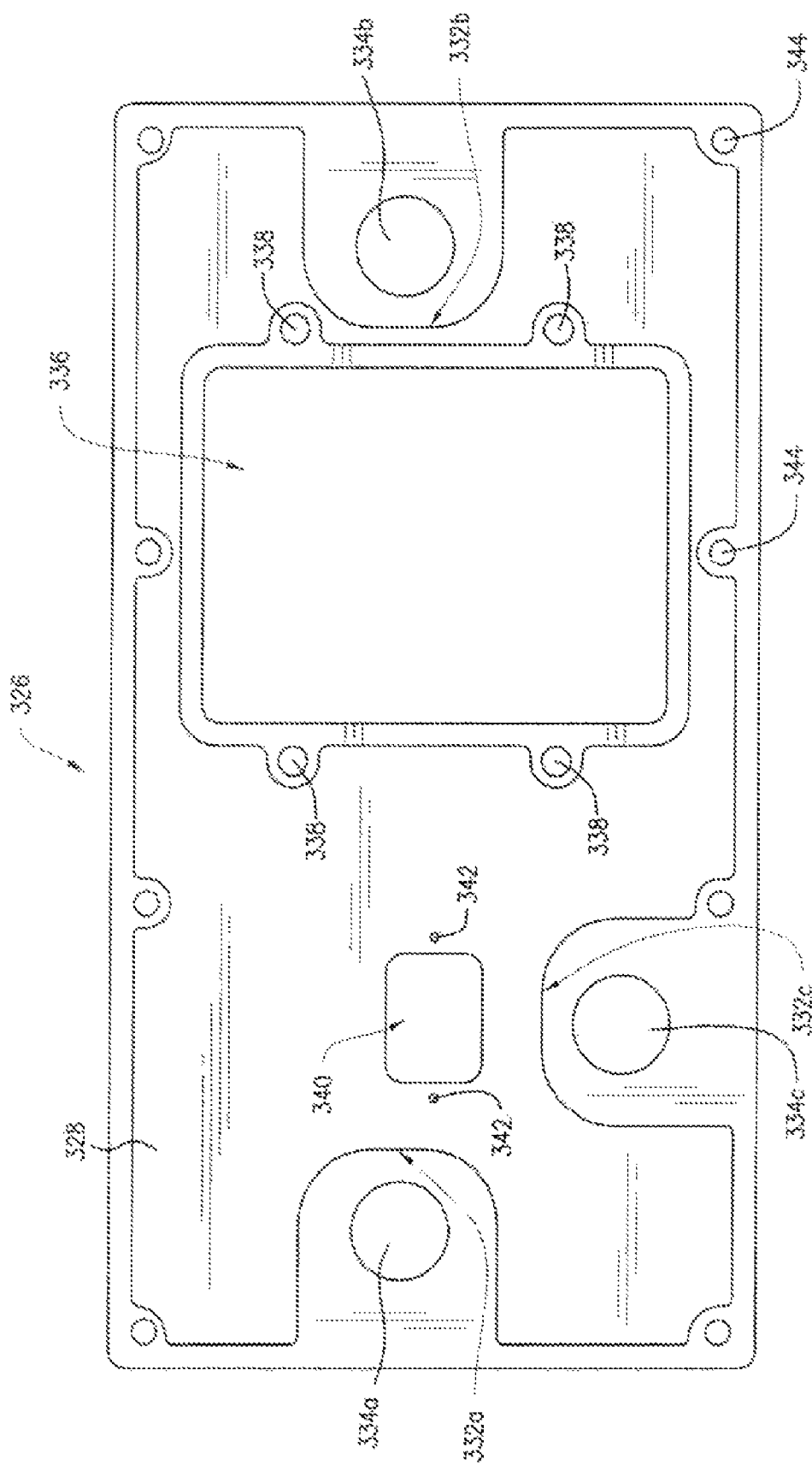
FIG. 10A shows a top plan view of a housing cover employed by the energy storage device shown in FIG. 1.

Referring to FIGS. 10A and 10B, the energy storage device 10 includes a rectangular-shaped cover 326 having a first surface 328 and a second surface 330 opposite thereof. A plurality of curved recesses 332a, 332b, 332c are formed in the first surface 328, each having a circular-shaped aperture 334a, 334b, 334c formed therein, respectively, and extending from the first surface 328 to the second surface 330. The cover 326 further includes a substantially rectangular-shaped aperture 336 extending from the first surface 328 to the second surface 330 and surrounded by screw holes 338, and a second rectangular-shaped aperture 340 extending from the first surface 328 to the second surface 330 and surrounded by a pair of diametrically opposed holes 342.

Still referring to FIGS. 10A and 10B, a plurality of screw holes 344 are formed around the perimeter of the cover 336 and extend from the first surface 328 to the second surface 330. O-rings 346 are installed around the apertures 334a, 334b, 334c on the second surface 330, while a seal 348 is installed around the perimeter on the second surface 330. A bulkhead connector 350, which is shown in FIG. 10C, is inserted into the aperture 340 and attached by screws through the holes 342. The bulkhead connector 350 may be supplied by Molex, part number 19429-013. However, the bulkhead connector 350 may be made by other manufacturers and/or consist of other models. The bulkhead connector 350 is connected to the wires 228 and to other components of the printed circuit board 278 (not shown in the Figures). The bulkhead connector 350 allows for external monitoring of the conditions of the capacitors 52*a-c*, 54*a-c*, 222*a-c*, 224*a-c*, such as their voltage, temperature, etc.

Figure 10D:
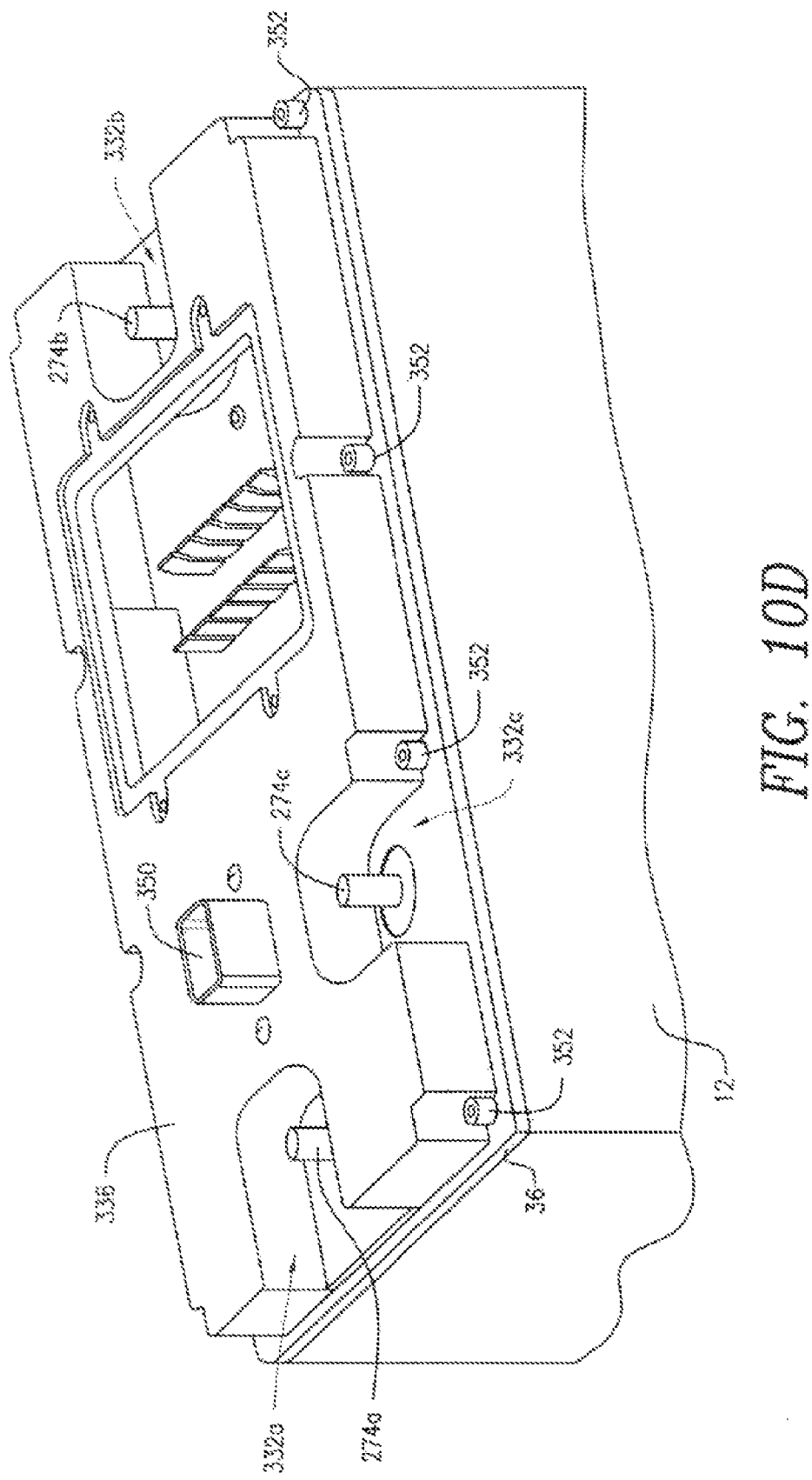
FIG. 10D shows a top perspective view of the housing cover shown in FIG. 9A mounted to the housing shown in FIG. 9C and the connector shown in FIG. 10C mounted to the cover.

With reference to FIG. 10D, the cover 326 is sized and shaped to be mounted on the top end 36 of the housing 12. The screw holes 344 of the cover 326 align with the threaded inserts 44 of the housing 12, and thus the cover 326 is secured to the housing 12 by screws 352. The studs 274*a*, 274*b*, 274*c* protrude through the apertures 334*a*, 334*b*, 334*c*, respectively. The recesses 332*a*, 332*b*, 332*c* provide for easy access to the studs 274*a*, 274*b*, 274*c* for connecting electrical cables thereto (not shown in the Figures).

Referring to FIG. 11A, the energy storage device 10 includes a first rectangular-shaped heat sink 354 having a first surface 356 and a second surface 358 opposite thereof. A rectangular-shaped aperture 360 extends from the first surface 356 to the second surface 358. A plurality of rectangular-shaped exterior fins 362 extend from the first surface 356 parallel to one another, while a pair of interior fins 364 extend outwardly from the second surface 358 and parallel to one another. A plurality of eyelets 366 extend around the perimeter of the heat sink 354, while a plurality of holes 368 are formed around the perimeter of the aperture 360. With reference to FIG. 11B, the heat sink 354 includes a rectangular-shaped spring retainer 370 that is sized and shaped to be inserted within the aperture 360. Spring clips 372 are mounted to projections 374 extending from the spring retainer 370. Eyelets 376 extend from a perimeter of the spring retainer 370, which enables it to be fastened to the heat sink 354 by screws within the eyelets 376 and the corresponding holes 368.

Figure 11C:
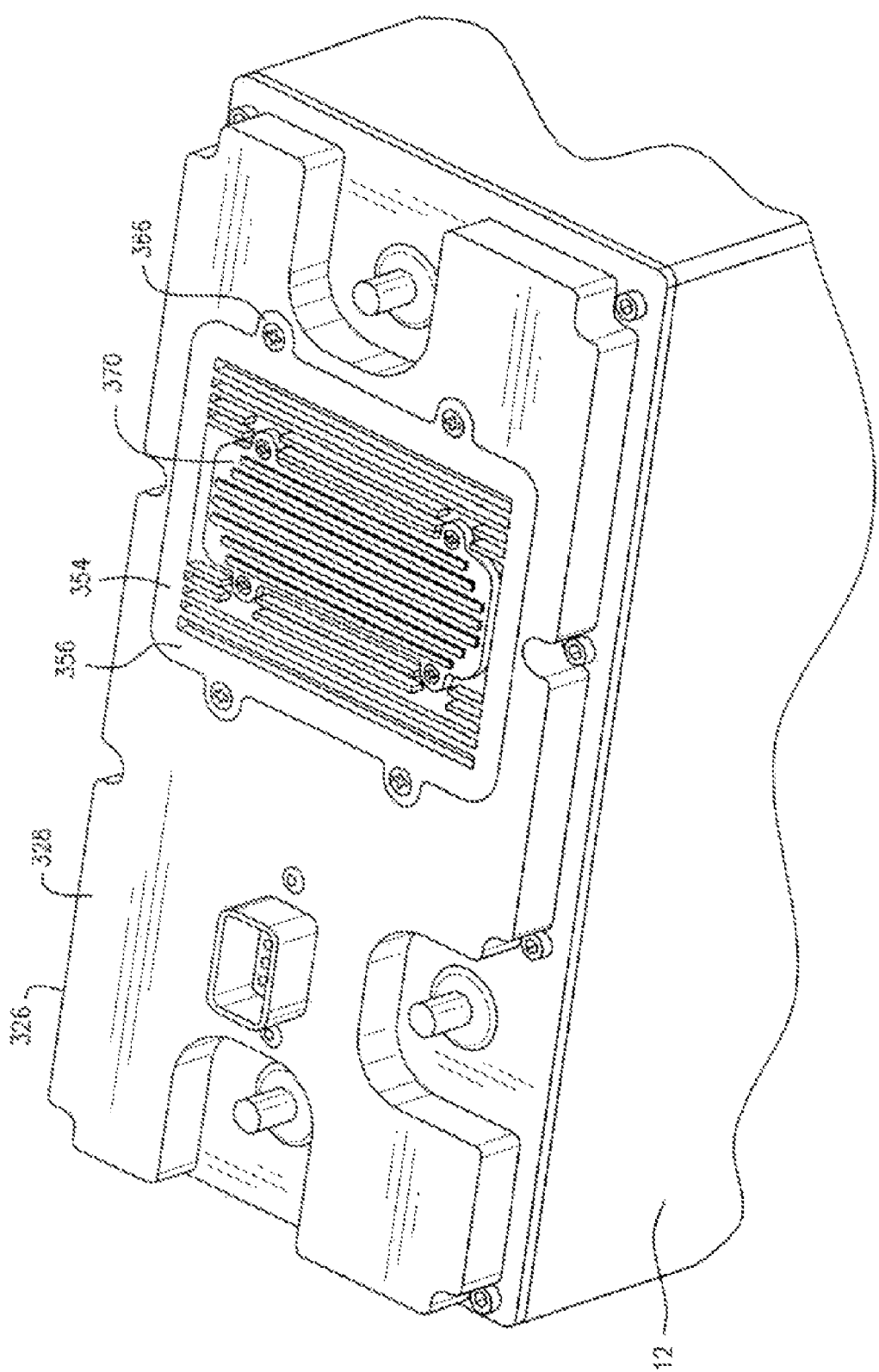
FIG. 11C shows a top perspective view of the energy storage device shown in FIG. 1 with the heat sink and spring retainer shown in FIGS. 11A and 11B mounted thereto.

Referring to FIG. 11C, the heat sink 354 is inserted into the aperture 336 of the cover 326, with the first surface 356 of the heat sink 334 being flush with the first surface 328 of the cover 326. In this manner, the first surface 356 of the heat sink 354 is exposed to the atmosphere exterior to the housing 12, and the second surface 358 of the heat sink 354 is contained within the housing 12. A gasket or an adhesive sealant may be added between the heat sink 354 and the first surface 328 of the cover 326 in order to provide a sealed engagement therebetween (not shown in the Figures).

Screws are inserted through the eyelets 366 of the heat sink 354 and the screw holes 338 of the cover 326 in order to fasten the heat sink 354 thereto. The spring clips 372 engage the switching devices 282. In one embodiment of the present invention, the contact between the switching devices 282 and the heat sink 354 is provided by thermally conductive silicon pads (not shown in the Figures). The silicon pads do not conduct electricity, and, therefore, they provide a thermally conductive contact to the switching devices 282 while maintaining electrical isolation of the switching devices 282. The pads contact the interior fins 364 of the heat sink 354, while the spring retainer 370 helps maintain the mechanical engagement of the pads to the heat sink 354. While it is preferable to use the pads, they need not be included.

The heat sink 354 is manufactured from a thermally conductive material, such as, for example, an aluminum alloy. However, other materials known in the art may be utilized. While the heat sink 354 is of a two piece construction as described above, it may have a unitary construction. In addition, while the heat sink 354 and the housing 12 are separate components, they may be of unitary construction. While the energy storage device 10 preferably includes the heat sink 354, it need not be included. Alternatively, the energy storage device 10 may include more than the one heat sink 354.

The heat sink 354 dissipates heat generated within the housing 12 to an exterior of the housing 12 by convection. The term "convection" is heat transfer by mass motion of a fluid, such as air. The heat sink 354 dissipates heat generated by the DC-DC converter 288, the switching devices 282, and/or the capacitors 52*a-c*, 54*a-c*, 222*a-c*, 226*a-c*, whereby heat is transferred to the heat sink 354 and is then dissipated from the housing 12 to the exterior atmosphere.

The energy storage device 10 is installed within a motor vehicle and electrically connected to an electrical system of the vehicle (not shown in the Figures). More particularly, the stud 274*a*, which represents a positive connection of the device 10, is connected electrically to a positive terminal of the vehicle's battery via an electrical cable or other electrical connection means known in the art (not shown in the Figures). Similarly, the stud 274*b*, which represents a negative or ground connection of the device 10, is connected electrically to a negative terminal (i.e., ground) of the vehicle's battery via an electrical cable or other electrical connection means known in the art (not shown in the Figures). Consequently, electrical connectivity between the DC-DC converter 276 and the vehicle's battery is provided. Meanwhile, the stud 274*c*, which represents an output connection of the energy storage device 10, is connected electrically to the net positive terminal of the capacitors 52*a-c*, 54*a-c*, 226*a-c*, 228*a-c* (i.e., the connector 310), and to an engine starting motor (i.e., starter) of the vehicle (not shown in the Figures). Thus, an electrical connection from the capacitors 52*a-c*, 54*a-c*, 226*a-c*, 228*a-c* to the starter represents an output from the DC-DC converter 288.

Because the energy storage device 10 is, preferably, sized and shaped as that of a standard motor vehicle battery (for example, a Group 31 type battery), it may be easily installed within a battery tray of a motor vehicle. In addition, the energy storage device 10 provides power similar to or greater than that of a standard motor vehicle battery. Consequently, the energy storage device 10 can substitute one or more of the vehicle's batteries, resulting in savings of weight of the vehicle and space within the vehicle's engine compartment.

During an engine start cycle, energy discharges from the capacitors 52*a-c*, 54*a-c*, 222*a-c*, 224*a-c* to the starter motor of the engine, wherein the stored voltage of the capacitors 52*a-c*, 54*a-c*, 222*a-c*, 224*a-c* provides energy to start the vehicle's engine. In the event of a no-start, the capacitors 52*a-c*, 54*a-c*, 222*a-c*, 224*a-c* are charged by the vehicle's battery. The DC-DC converter 276 dictates that the capacitors 52*a-c*, 54*a-c*, 222*a-c*, 224*a-c* are charged at the correct voltage. So long as battery voltage is available, the capacitors 52*a-c*, 54*a-c*, 222*a-c*, 224*a-c* may be charged for another start attempt, regardless of whether the battery is sufficiently charged or have been discharged to a voltage that is below the threshold start voltage.

The capacitors 52*a-c*, 54*a-c*, 222*a-c*, 224*a-c* provide power and energy directly to the vehicle's engine starter motor via the stud 274*c* during a start, while the vehicle's battery, via the studs 274*a*, 274*b*, provides power to the DC-DC converter 276 in order to charge and recharge the capacitors 52*a-c*, 54*a-c*, 222*a-c*, 224*a-c*. As a result, the electrical connection between the engine starter motor and the energy storage device 10 is separate and distinct from the electrical connection between the device 10 and the vehicle's battery.

In one embodiment of the present invention, the energy storage device 10 provides enough power to support a minimum of two unassisted consecutive engine crank cycles for a 5.9L to 9.3L diesel engine for about three to five seconds per engine crank cycle at a temperature of as low as −18° C. Alternatively, the energy storage device 10 can provide power to support more or less than two crank cycles and/or different cranking time periods. Also, the energy storage device 10 may be used with different types of engines and/or engines having different sizes. In addition, the energy storage device 10 can operate under various temperatures, with a typical operating temperature range being about −40° C. to 85° C. However, the energy storage device 10 can be used in greater or narrower temperature ranges.

The plate 248 not only functions as a physical barrier between the DC-DC converter 276 and the capacitors 52*a-c*, 54*a-c*, 226*a-c*, 228*a-c*, it also functions as a thermal barrier that insulates the capacitors 52*a-c*, 54*a-c*, 226*a-c*, 228*a-c* from any heat generated by the DC-DC converter 276 and its associated electronics. Thus, the capacitors 52*a-c*, 54*a-c*, 226*a-c*, 228*a-c*, which are normally sensitive and delicate in nature, are protected in order to assure their proper function.

A driver interface system may be provided to allow for two-way communication between the vehicle's driver and the energy storage device 10 (not shown in the Figures). For example, the driver interface system may include audio indicators and/or a visual display for communicating the conditions of the energy storage device 10 to the vehicle's dashboard (e.g., via indicator lights, bars, graphs, LCD panel, etc.). The driver can monitor, diagnose and change the conditions of the energy storage device 10. The driver interface system may be hard-wired to the energy storage device 10, or be in wireless communication thereto (e.g., common network, blue-tooth, RFID, etc.).

Although the energy storage device 10 can be used for starting an internal combustion engine for a motor vehicle, it can be utilized in connection with other types of engines or vehicles. In addition, the energy storage device 10 can be used to store energy for supplying electric loads for various transportation systems applications. These include electrical motors, electric steering devices, electrically boosted turbo chargers, lift gates for trucks, tractor trailers and other vehicles, electrical hydraulic systems, and similar devices and applications.

Figure 13:
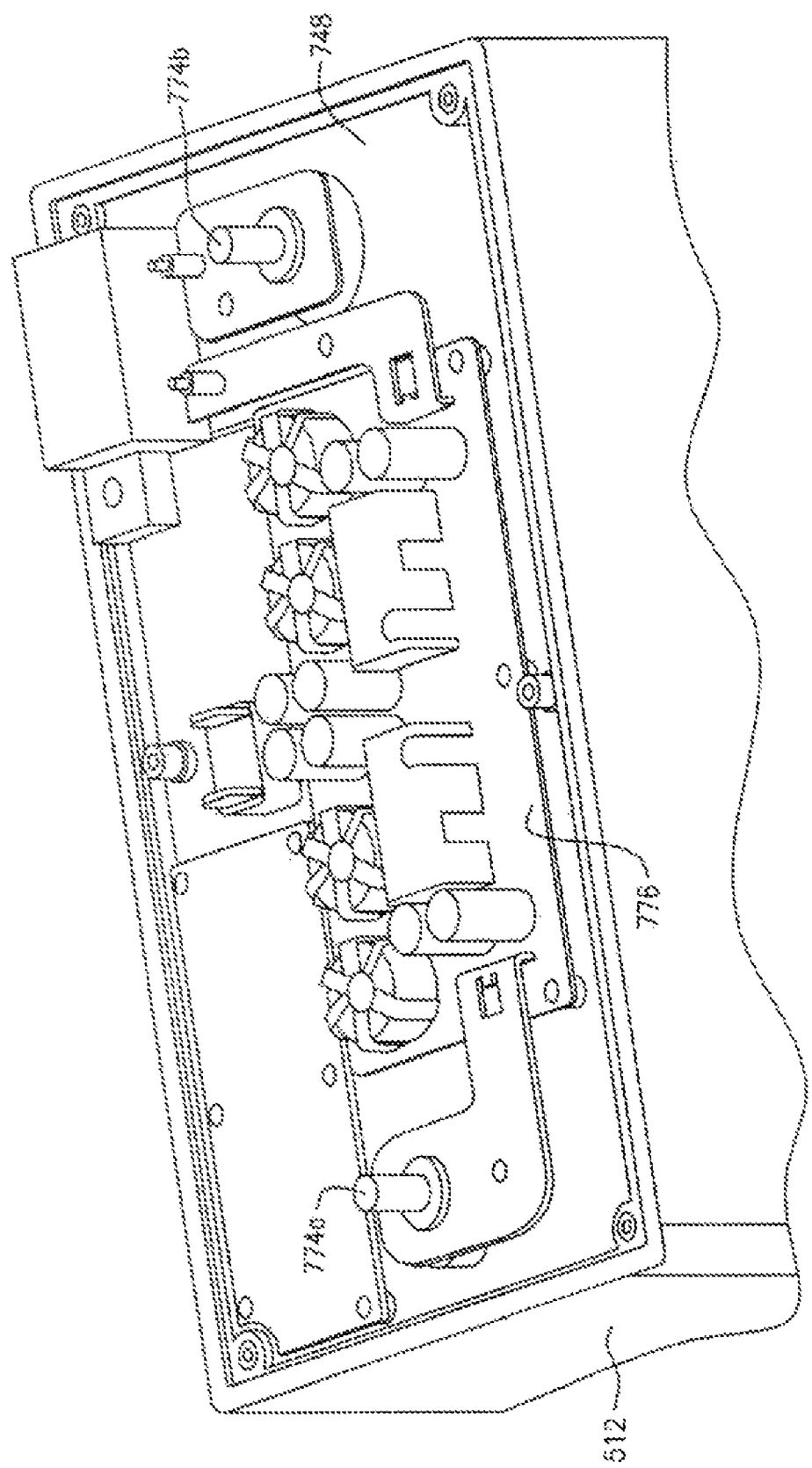
FIG. 13 shows a top perspective view of the energy storage device shown in FIG. 12 with a housing cover employed thereby removed.

Another exemplary embodiment of the present invention is illustrated in FIGS. 12 and 13. Element illustrated in FIGS. 12 and 13 that correspond to the elements described above with reference to FIGS. 1 through 11C have been designated by corresponding reference numerals increased by five hundred (500). The embodiment of FIGS. 12 and 13 operates in the same manner as the embodiment shown in FIGS. 1 through 11C, unless it is otherwise stated.

Referring to FIG. 12, an energy storage device 510 includes a rectangular boxed shaped housing 512 having a cover 826, and a pair of studs 774*a*, 774*b* protruding therefrom. Referring to FIG. 13, the energy storage device 510 includes a DC-DC converter 776 mounted to a thermally insulated isolation plate 748, which physically separates the DC-DC converter 776 from capacitor cell modules (not shown in FIG. 13) and protects such modules from heat generated by the DC-DC converter 776 and its associated electronics.

The energy storage device 510 is constructed and functions similar to that of the energy storage device 10 with some notable exceptions. That is, the stud 774*a* serves as both a positive electrical connection to a positive terminal of a vehicle's battery, and an output connection to a starter of the vehicle (not shown in the Figures). In addition, the energy storage device 510 shown in FIGS. 12 and 13 does not employ any heat sink, but the device 510 can include one or more heat sinks.

It will be understood that the embodiments of the energy storage device described herein are merely exemplary and that a person skilled in the art may make many variations and modifications without departing from the full spirit and the scope of the embodiments described herein. Accordingly, all such variations and modifications are intended to be included within the scope of the embodiments described herein as defined in the appended claims.

We claim:

1. An energy storage device for use in connection with an independently-operable engine of a motor vehicle, the engine including a battery and an engine starter, the energy storage device comprising:
 a DC-DC converter for converting a first voltage provided from the battery to a second voltage;
 at least one capacitor, electrically connected to said DC-DC converter, for storing the second voltage, the second voltage providing energy for starting the engine of the motor vehicle;
 a portable housing for housing said DC-DC converter and said at least one capacitor, said DC-DC converter and said at least one capacitor substantially contained within said portable housing, wherein said energy storage device is separate from and selectively coupleable to said independently-operable engine wherein said housing includes a first area for housing said DC-DC converter and a second area for housing a first and second plurality of capacitors; a barrier, positioned within said housing, for substantially separating said first and second areas of said housing from one another, said barrier includes a thermally insulated plate having a first surface and a second surface opposite thereof, said first surface of said plate being positioned within said first area of said housing, and said second surface of said plate being positioned within said second area of said housing, said DC-DC converter is mounted to said first surface of said plate; and a heat sink having a first surface and a second surface opposite thereof, said first surface of said heat sink is exposed to said first area of said housing, and said second surface of said heat sink is exposed to an atmosphere exterior to said housing.

2. The energy storage device of claim 1, wherein said at least one capacitor includes a plurality of capacitors.

3. The energy storage device of claim 2, further comprising a retention structure for providing structural support to said plurality of capacitors.

4. The energy storage device of claim 3, wherein said plurality of capacitors is arranged in a first column and a second column by said retention structure.

5. The energy storage device of claim 4, wherein said retention structure includes a first structural member positioned intermediate said first and second columns, a second structural member and a third structural member, said first column being positioned intermediate said first structural member and said second structural member, and said second column being positioned intermediate said first structural member and said third structural member.

6. The energy storage device of claim 5, wherein said first structural member includes a first surface and a second surface opposite thereof, said first surface having a first plurality of recesses and said second surface having a second plurality of recesses, each of said first plurality of recesses is sized and shaped to receive a corresponding one of said plurality of capacitors of said first column, and each of said second plurality of recesses is sized and shaped to receive a corresponding one of said plurality of capacitors of said second column.

7. The energy storage device of claim 6, wherein said second structural member includes a first surface having a third plurality of recesses and said third structural member includes a first surface having a fourth plurality of recesses, each of said third plurality of recesses is sized and shaped to receive a corresponding one of said plurality of capacitors of said first column, and each of said fourth plurality of recesses is sized and shaped to receive a corresponding one of said plurality of capacitors of said second column.

8. The energy storage device of claim 7, wherein said at least one capacitor includes a second plurality of capacitors and a second retention structure for providing structural support to said second plurality of capacitors.

9. The energy storage device of claim 8, wherein said second plurality of capacitors is arranged in a first column and a second column by said second retention structure.

10. The energy storage device of claim 9, wherein said second retention structure includes a first structural member positioned intermediate said first and second columns of said second plurality of capacitors, a second structural member and a third structural member, said first column of said second plurality of capacitors being positioned intermediate said first structural member of said second retention structure and said second structural member of said second retention structure, and said second column of said second plurality of capacitors being positioned intermediate said first structural member of said second retention structure and said third structural member of said second retention structure.

11. The energy storage device of claim 10, wherein said first structural member of said second retention structure includes a first surface and a second surface opposite thereof, said first surface of said first structural member of said second retention structure having a first plurality of recesses, and said second surface of said first structural member of said second retention structure having a second plurality of recesses, each of said first plurality of recesses of said first structural member of said second retention structure is sized and shaped to receive a corresponding one of said second plurality of capacitors of said first column thereof, and each of said second plurality of recesses of said first structural member of said second retention structure is sized and shaped to receive a corresponding one of said second plurality of capacitors of said second column thereof.

12. The energy storage device of claim 11, wherein said second structural member of said second retention structure includes a first surface having a third plurality of recesses, and said third structural member of said second retention structure includes a first surface having a fourth plurality of recesses, each of said third plurality of recesses of said second structural member of said second retention structure is sized and shaped to receive a corresponding one of said second plurality of capacitors of said first column thereof, and each of said fourth plurality of recesses of said third structural member of said second retention structure is sized and shaped to receive a corresponding one of said second plurality of capacitors of said second column thereof.

13. The energy storage device of claim 1, wherein said housing is sized and shaped substantially to that of a motor vehicle battery housing.

14. The energy storage device of claim 13, wherein said first and second plurality of capacitors includes a net positive terminal and a net negative terminal.

15. The energy storage device of claim 14, further comprising a first electrical terminal connected electrically to said net negative terminal of said first and second plurality of capacitors and a positive terminal of a motor vehicle battery, a second electrical terminal connected electrically to ground, and a third electrical terminal electrically connected to said net positive terminal of said first and second plurality of capacitors and to a starter of the motor vehicle.

16. The energy storage device of claim 15, wherein said first, second and third electrical terminals extend outwardly from said cover of said housing.

17. The energy storage device of claim 1, wherein said housing includes a first end and a cover removably mounted to said first end, said heat sink mounted to said cover of said housing.

18. An energy storage device for storing energy for starting an engine of a motor vehicle, comprising:
a DC-DC converter for converting a first voltage generated by an electrical system of the motor vehicle to a second voltage;
a plurality of capacitors, electrically connected to said DC-DC converter, for storing the second voltage, the second voltage providing energy for starting the engine of the motor vehicle;
a housing having a first area for housing said DC-DC converter and a second area for housing said plurality of capacitors, said DC-DC converter and said plurality of capacitors are self-contained within said housing, said housing being sized and shaped substantially of that of a motor vehicle battery housing;
a thermally insulated barrier positioned between said first and second area of said housing for separating said DC-DC converter from said plurality of capacitors;
and a heat sink mounted to said housing, said heat sink being in thermal communication with said DC-DC converter for dissipating heat generated by said DC-DC converter to an atmosphere exterior to said housing.

* * * * *